United States Patent
Tsuchiya

(10) Patent No.: US 8,253,836 B2
(45) Date of Patent: Aug. 28, 2012

(54) SOLID-STATE IMAGING DEVICE, IMAGING DEVICE AND DRIVING METHOD OF SOLID-STATE IMAGING DEVICE

(75) Inventor: Hiroyuki Tsuchiya, Kanagawa (JP)

(73) Assignee: Sony Corporation, Tokyo (JP)

( * ) Notice: Subject to any disclaimer, the term of this patent is extended or adjusted under 35 U.S.C. 154(b) by 468 days.

(21) Appl. No.: 12/429,700

(22) Filed: Apr. 24, 2009

(65) Prior Publication Data

US 2009/0295971 A1 Dec. 3, 2009

(30) Foreign Application Priority Data

May 30, 2008 (JP) ................................. 2008-142336

(51) Int. Cl.
*H04N 5/335* (2011.01)
(52) U.S. Cl. ......... 348/311; 348/304; 348/305; 348/317
(58) Field of Classification Search .......... 348/294–297, 348/300–308, 317–320; 250/208.1
See application file for complete search history.

(56) References Cited

U.S. PATENT DOCUMENTS

| 5,539,461 A | 7/1996 | Andoh et al. |
| 7,638,826 B2 * | 12/2009 | Hiyama et al. ................. 257/291 |
| 7,911,518 B2 * | 3/2011 | Yosefin .......................... 348/273 |

FOREIGN PATENT DOCUMENTS

| JP | 03-119874 | 5/1991 |
| JP | 06-131708 | 5/1994 |
| JP | 09-046596 | 2/1997 |
| JP | 2000-059696 | 2/2000 |
| JP | 2007-150008 | 6/2007 |

* cited by examiner

*Primary Examiner* — Huy K Mai
(74) *Attorney, Agent, or Firm* — Robert J. Depke; Rockey, Depke & Lyons, LLC

(57) ABSTRACT

A solid-state imaging device includes a pixel array section having unit pixels arranged two-dimensionally in a matrix form. Each of the unit pixels includes a charge generation section configured to generate a signal charge, charge transfer sections configured to transfer the signal charge generated by the charge generation section, and a signal output section configured to generate and output a target signal commensurate with the charge of the signal generated by the charge generation section. The plurality of charge transfer sections are provided for each of the charge generation sections. The plurality of charge transfer sections are connected, on the side opposite to the charge generation section, to the signal output sections in different rows.

10 Claims, 33 Drawing Sheets

ACCUMULATION AND SIMULTANEOUS READOUT SCHEME
(ex:READOUT SCHEME FOR CCD)

ACCUMULATION AND SEQUENTIAL READOUT SCHEME
(ex:READOUT SCHEME FOR CMOS)

ACCUMULATION AND SEQUENTIAL READOUT SCHEME

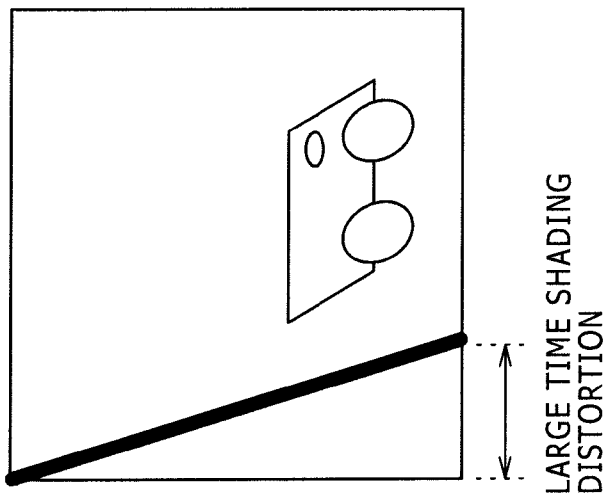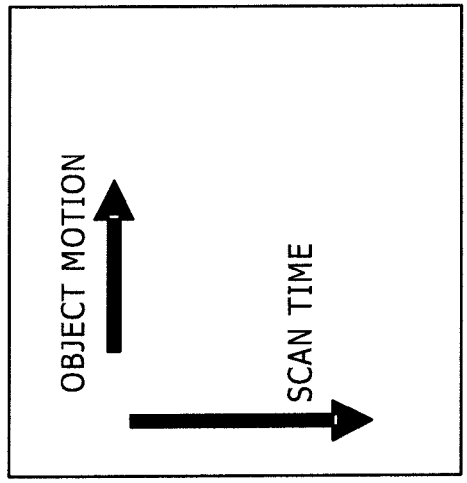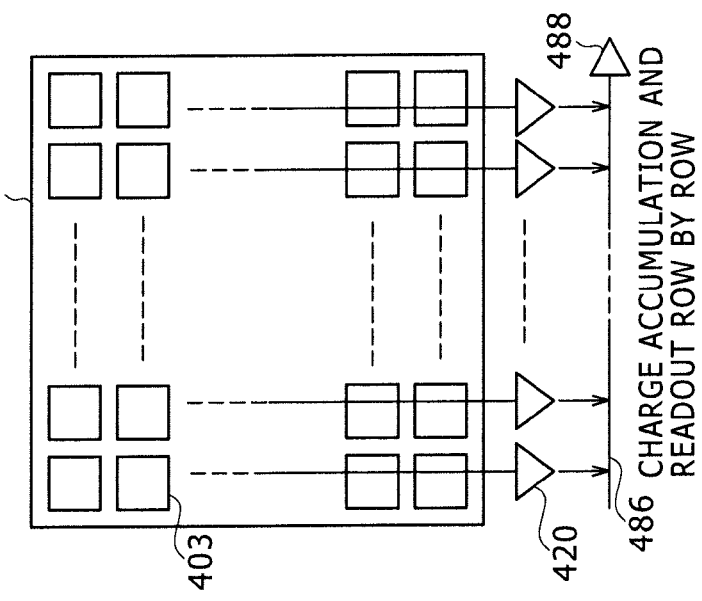

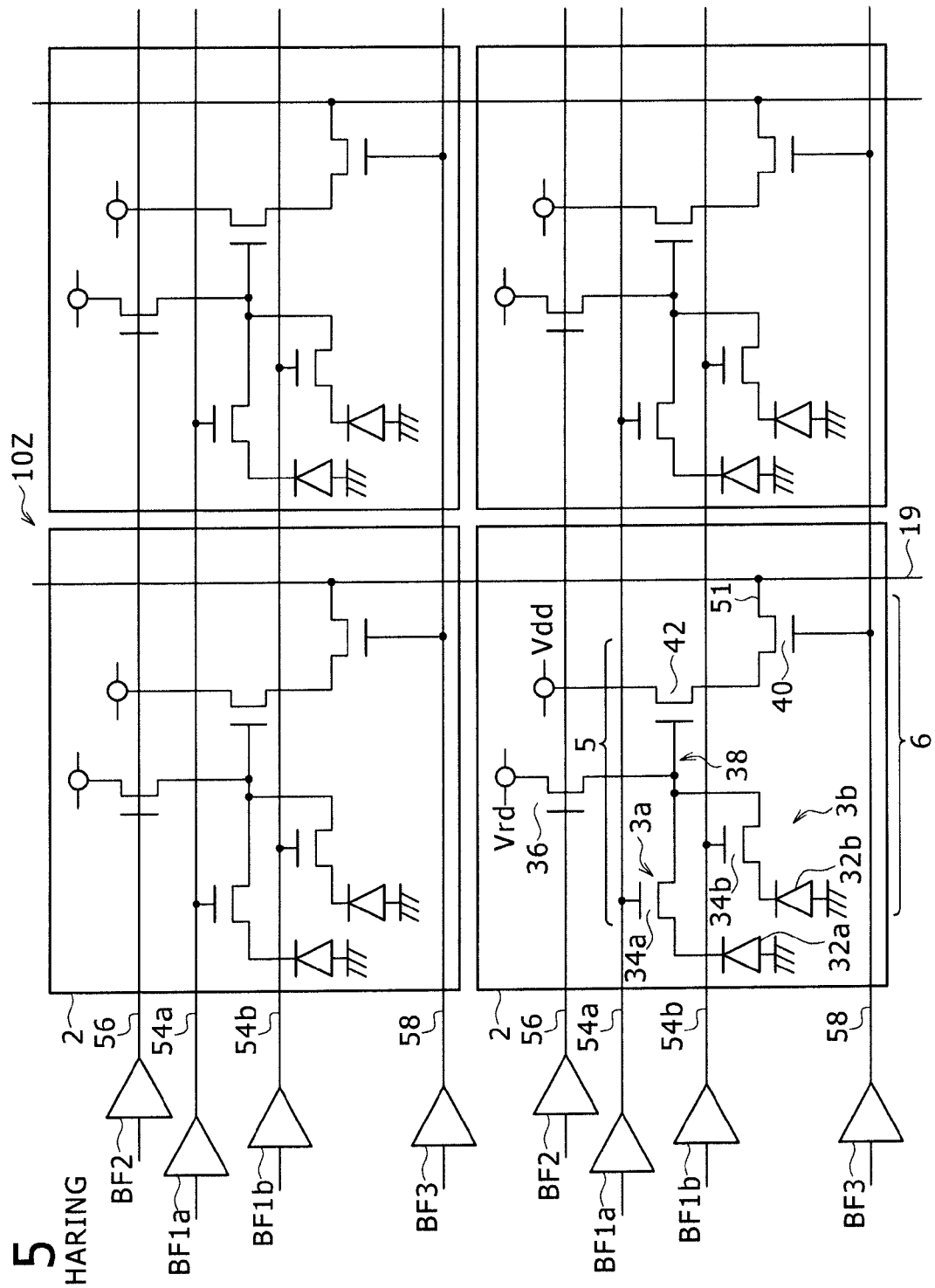

FIG. 7

| FIELD | UNIT PIXEL GROUP | | | | REMARKS |
|---|---|---|---|---|---|
| | CHARGE GENERATION SECTION | READOUT SELECTION TRANSISTOR | PIXEL SIGNAL GENERATION SECTION | VERTICAL SELECTION TRANSISTOR | |
| ODD | 32_2n-1 | 34D_2n-1 | 5_2n-1 | 40_2n-1 | ADDITION OF 2 PIXELS |
| | 32_2n | 34D_2n | | | |
| EVEN | 32_2n | 34D_2n | 5_2n | 40_2n | ADDITION OF 2 PIXELS |
| | 32_2n+1 | 34D_2n+1 | | | |

DURING READOUT OR ELECTRONIC SHUTTER
THE INACTIVE LEVEL OF THE GATE OF THE OTHER READOUT SELECTION TRANSISTER 34 NOT USED FOR SIGNAL CHARGE TRANSFER CAN BE DECREASED TO A LOWER-THAN-NORMAL LEVEL

FIG.12A-1
ODD FIELD TARGET PIXELS

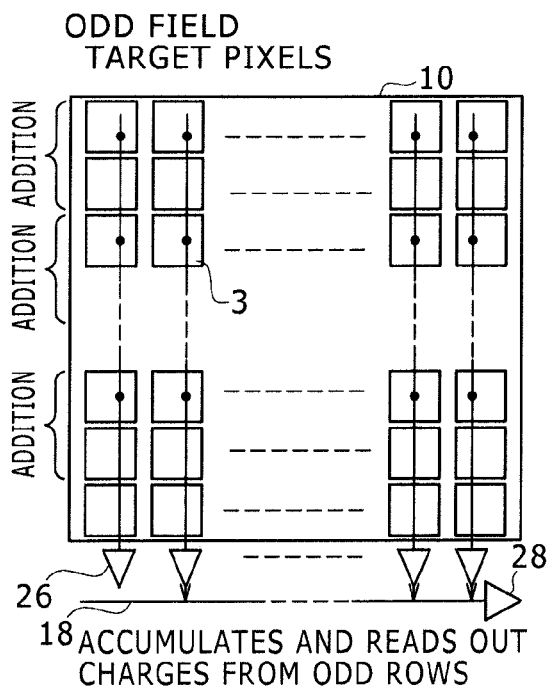

18 ACCUMULATES AND READS OUT CHARGES FROM ODD ROWS

FIG.12B-1
EVEN FIELD TARGET PIXELS

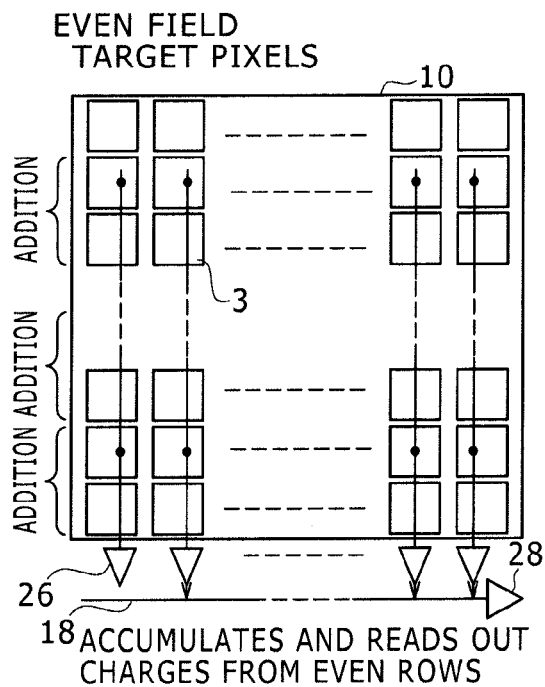

18 ACCUMULATES AND READS OUT CHARGES FROM EVEN ROWS

FIG.12A-2
ODD FIELD
TIME SHADING DISTORTON IN LINE DIRECTION
DUE TO DIFFERENCE IN ACCUMULATION TIME

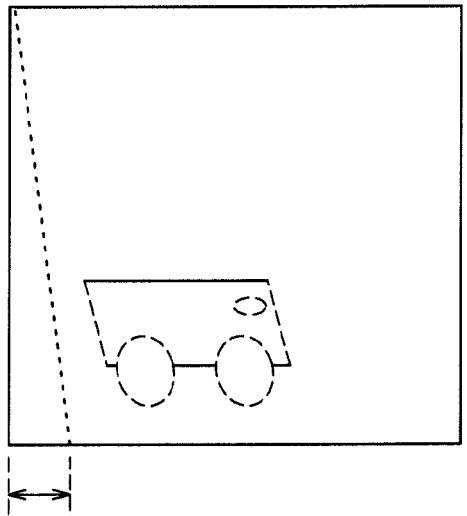

SMALL TIME SHADING DISTORTION

FIG.12B-2
EVEN FIELD
TIME SHADING DISTORTON IN LINE DIRECTION
DUE TO DIFFERENCE IN ACCUMULATION TIME

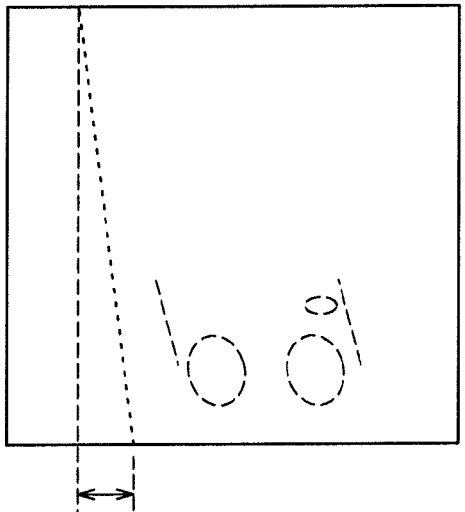

SMALL TIME SHADING DISTORTION

50% REDUCTION IN TIME SHADING DISTORTION IN BOTH FIELDS

FIG. 13

| | UNIT PIXEL | | | | REMARKS |
|---|---|---|---|---|---|
| | CHARGE GENERATION SECTION | READOUT SELECTION TRANSISTOR | PIXEL SIGNAL GENERATION SECTION | VERTICAL SELECTION TRANSISTOR | |
| 1ST EXAMPLE | 32_k | 34D_k | 5_k | 40_k | |
| 2ND EXAMPLE | 32_k+1 | 34U_k+1 | | | NO ADDITION OF 2 PIXELS |

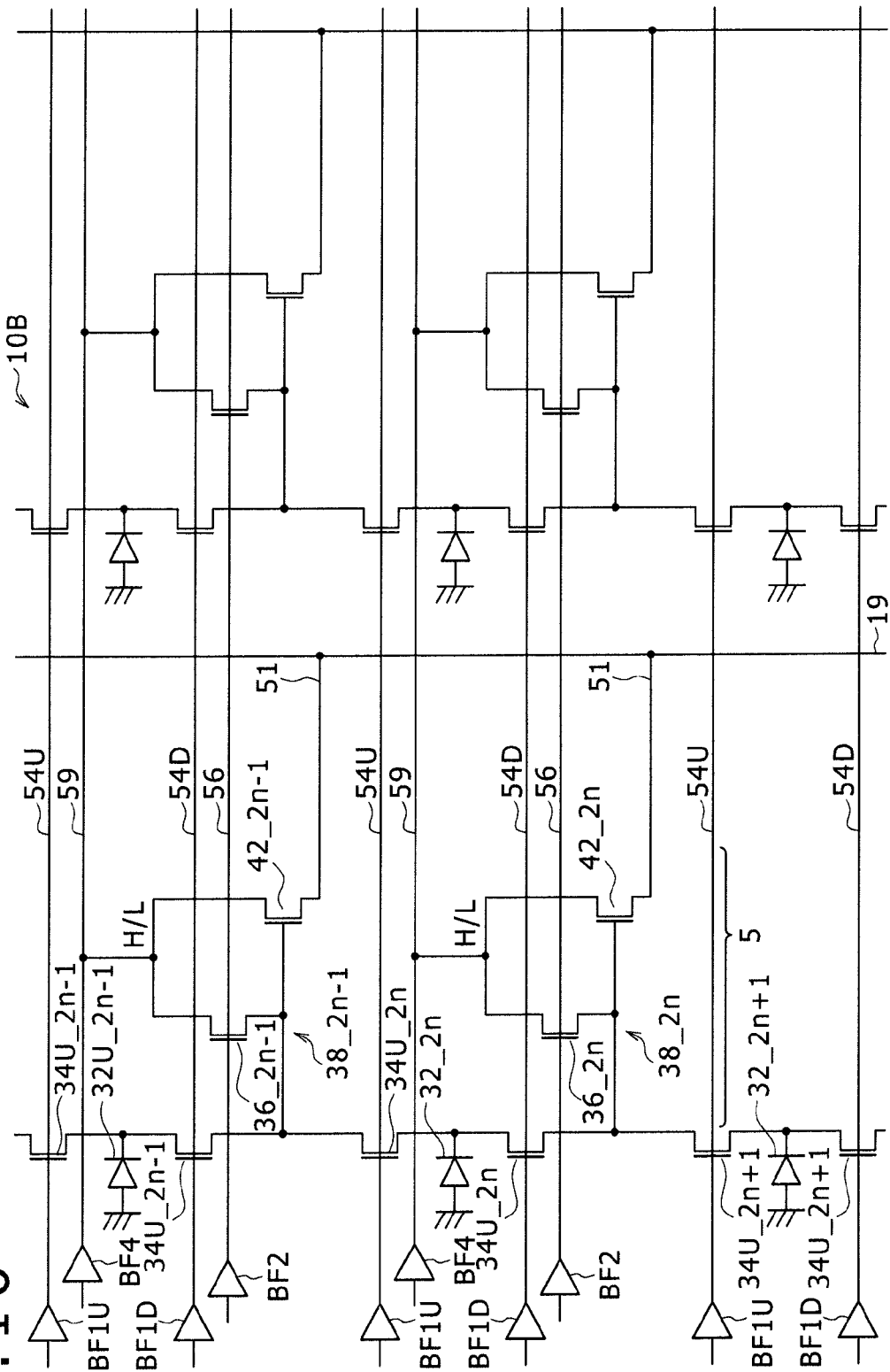
FIG.16 3-TRANSISTOR CONFIGURATION

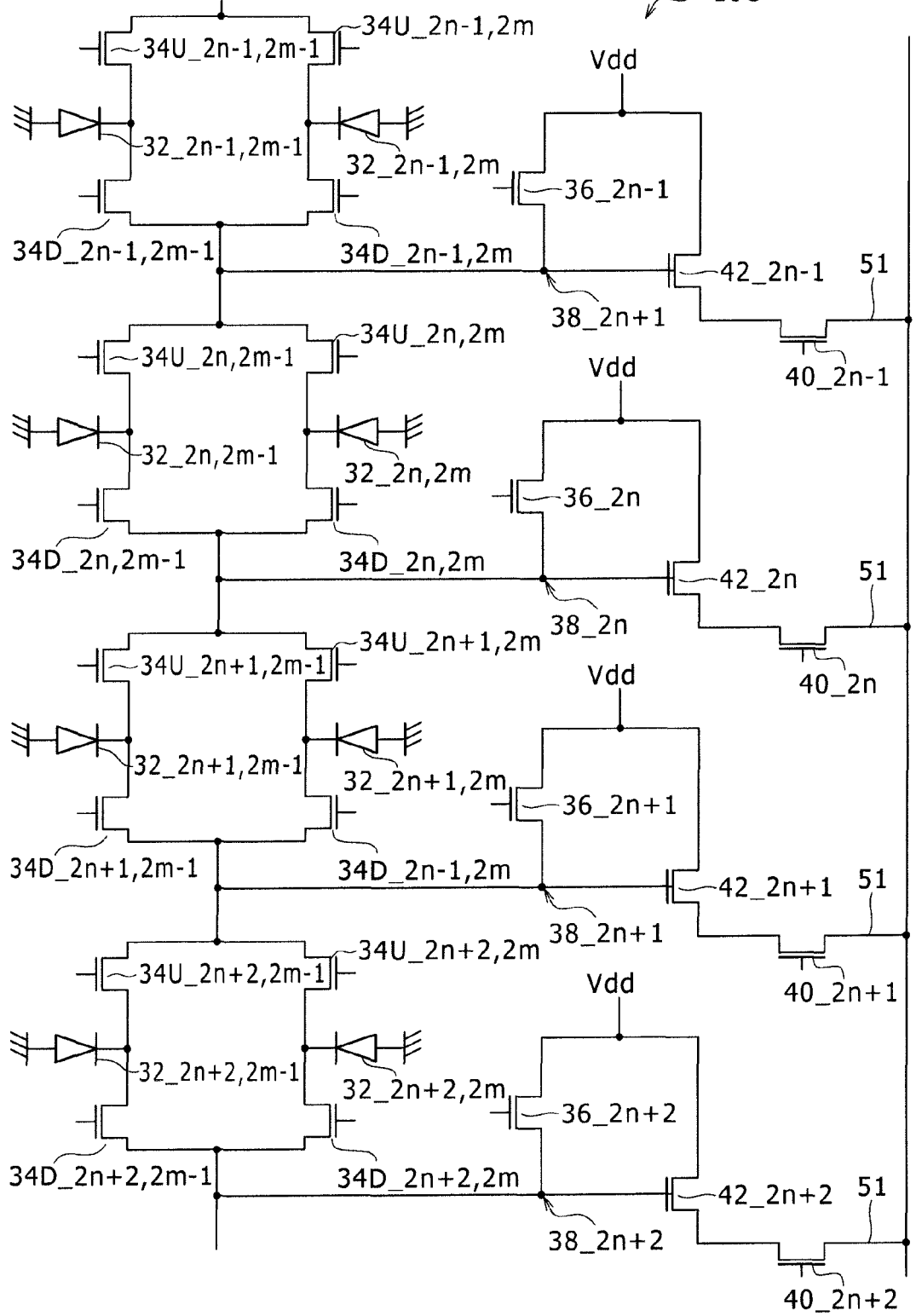

FIG.18A

| FIELD | UNIT PIXEL GROUP ||||| REMARKS |
| --- | --- | --- | --- | --- | --- |
| | CHARGE GENERATION SECTION | READOUT SELECTION TRANSISTOR | PIXEL SIGNAL GENERATION SECTION | VERTICAL SELECTION TRANSISTOR | |
| ODD | 32_2n-1,2m-1 | 34D_2n-1,2m-1 | 5_2n-1 | 40_2n-1 | ADDITION OF 2x2 PIXELS |
| | 32_2n,2m-1 | 34U_2n,2m-1 | | | |
| | 32_2n-1,2m | 34D_2n-1,2m | | | |
| | 32_2n,2m | 34U_2n,2m | | | |
| EVEN | 32_2n,2m-1 | 34D_2n,2m-1 | 5_2n | 40_2n | ADDITION OF 2x2 PIXELS |
| | 32_2n+1,2m-1 | 34U_2n+1,2m-1 | | | |
| | 32_2n,2m | 34D_2n,2m | | | |
| | 32_2n+1,2m | 34U_2n+1,2m | | | |

DURING READOUT OR ELECTRONIC SHUTTER
  THE INACTIVE LEVEL OF THE GATE OF THE OTHER READOUT
SELECTION TRANSISTER 34 NOT USED FOR SIGNAL CHARGE
TRANSFER CAN BE DECREASED TO A LOWER-THAN-NORMAL
LEVEL

FIG.18B

| FIELD | UNIT PIXEL GROUP ||||| REMARKS |
| --- | --- | --- | --- | --- | --- |
| | CHARGE GENERATION SECTION | READOUT SELECTION TRANSISTOR | PIXEL SIGNAL GENERATION SECTION | VERTICAL SELECTION TRANSISTOR | |
| 1ST EXAMPLE | 32_k,2m-1 | 34D_k,2m-1 | 5_k | 40_k | ADDITION OF 1x2 PIXELS |
| | 32_k,2m | 34D_k,2m | | | |
| 2ND EXAMPLE | 32_k+1,2m-1 | 34U_k+1,2m-1 | | | |
| | 32_k+1,2m | 34U_k+1,2m | | | |

4-TRANSISTOR CONFIGURATION & 45-GEG. ROTATION

45-DEG. ROTATION

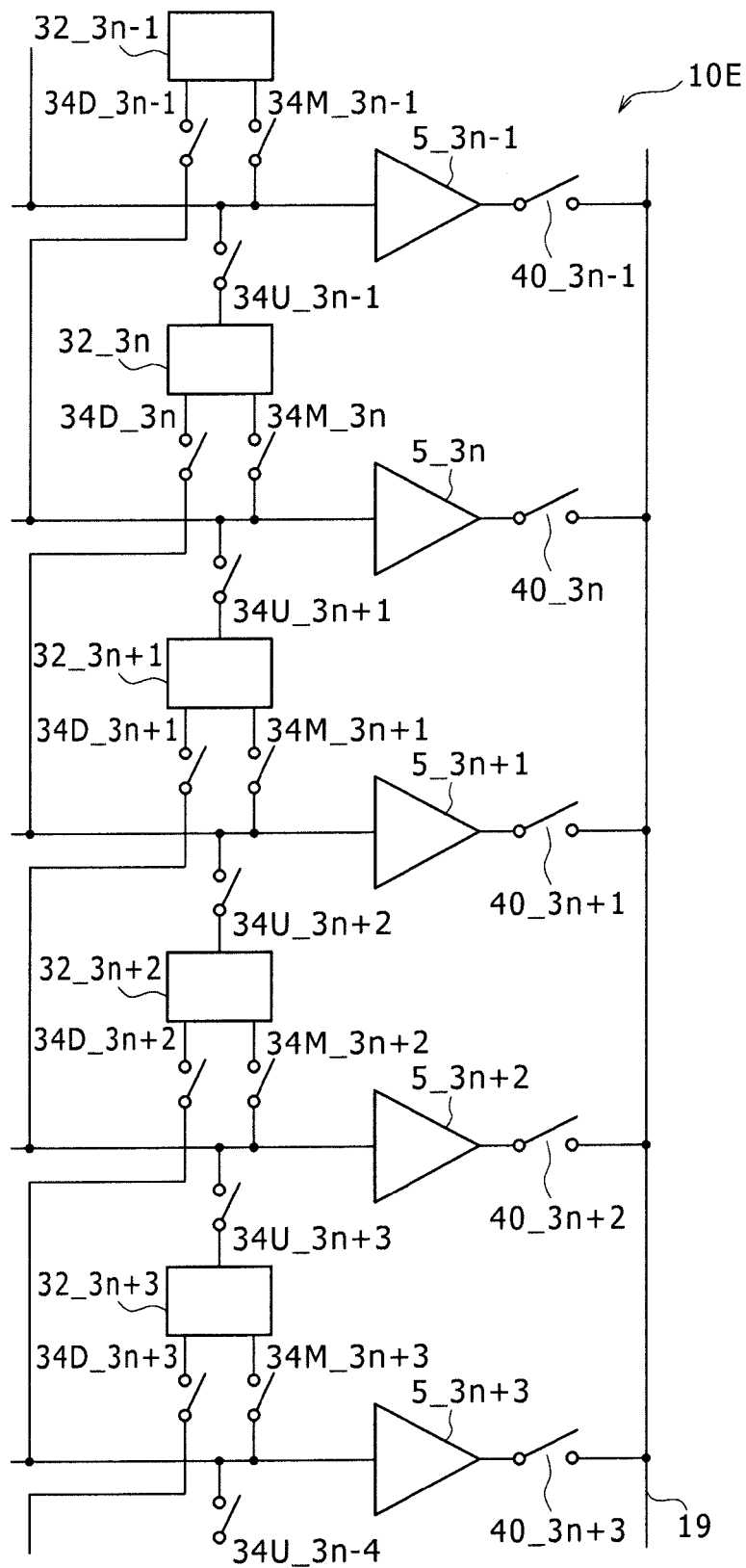

FIG.25A

| FIELD | UNIT PIXEL GROUP | | | | REMARKS |
| --- | --- | --- | --- | --- | --- |
| | CHARGE GENERATION SECTION | READOUT SELECTION TRANSISTOR | PIXEL SIGNAL GENERATION SECTION | VERTICAL SELECTION TRANSISTOR | |
| 1ST EXAMPLE | 32_3n-1 | 34D_3n-1 | 5_3n | 40_3n | ADDITION OF 3 PIXELS |
| | 32_3n | 34M_3n | | | |
| | 32_3n+1 | 34U_3n+1 | | | |
| 2ND EXAMPLE | 32_3n | 34D_3n | 5_3n+1 | 40_3n+1 | ADDITION OF 3 PIXELS |
| | 32_3n+1 | 34M_3n+1 | | | |
| | 32_3n+2 | 34U_3n+2 | | | |
| 3RD EXAMPLE | 32_3n+1 | 34D_3n+1 | 5_3n+2 | 40_3n+2 | ADDITION OF 3 PIXELS |
| | 32_3n+2 | 34M_3n+2 | | | |
| | 32_3n+3 | 34U_3n+3 | | | |

DURING READOUT OR ELECTRONIC SHUTTER
  THE INACTIVE LEVEL OF THE GATE OF THE OTHER READOUT
  SELECTION TRANSISTER 34 NOT USED FOR SIGNAL CHARGE
  TRANSFER CAN BE DECREASED TO A LOWER-THAN-NORMAL
  LEVEL

FIG.25B

| | UNIT PIXEL | | | | REMARKS |
| --- | --- | --- | --- | --- | --- |
| | CHARGE GENERATION SECTION | READOUT SELECTION TRANSISTOR | PIXEL SIGNAL GENERATION SECTION | VERTICAL SELECTION TRANSISTOR | |
| 1ST EXAMPLE | 32_k | 34M_k | 5_k | 40_k | NO ADDITION OF 3 PIXELS |
| 2ND EXAMPLE | 32_k-1 | 34D_k-1 | | | |
| 3RD EXAMPLE | 32_k+1 | 34U_k+1 | | | |

4-TRANSISTOR CONFIGURATION & 2-PIXEL ADDITION & 2 FIELDS

CHARGE GENERATION SECTIONS 32a AND 32b IN THE SAME COLUMN

FIG.30A

| FIELD | UNIT PIXEL GROUP | | | | REMARKS |
|---|---|---|---|---|---|
| | CHARGE GENERATION SECTION | READOUT SELECTION TRANSISTOR | PIXEL SIGNAL GENERATION SECTION | VERTICAL SELECTION TRANSISTOR | |
| ODD | 32a_2n-1 | 34aD_2n-1 | 5_2n-1 | 40_2n-1 | ADDITION OF 4 PIXELS |
| | 32a_2n | 34aU_2n | | | |
| | 32b_2n-1 | 34bD_2n-1 | | | |
| | 32b_2n | 34bU_2n | | | |
| EVEN | 32a_2n | 34aD_2n | 5_2n | 40_2n | ADDITION OF 4 PIXELS |
| | 32a_2n+1 | 34aU_2n+1 | | | |
| | 32b_2n | 34bD_2n | | | |
| | 32b_2n+1 | 34bU_2n+1 | | | |

DURING READOUT OR ELECTRONIC SHUTTER
  THE INACTIVE LEVEL OF THE GATE OF THE OTHER READOUT
  SELECTION TRANSISTER 34 NOT USED FOR SIGNAL CHARGE
  TRANSFER CAN BE DECREASED TO A LOWER-THAN-NORMAL
  LEVEL

FIG.30B

| FIELD | UNIT PIXEL GROUP | | | | REMARKS |
|---|---|---|---|---|---|
| | CHARGE GENERATION SECTION | READOUT SELECTION TRANSISTOR | PIXEL SIGNAL GENERATION SECTION | VERTICAL SELECTION TRANSISTOR | |
| 1ST EXAMPLE | 32a_k | 34aD_k | 5_k | 40_k | ADDITION OF 2 PIXELS |
| | 32b_k | 34bD_k | | | |
| 2ND EXAMPLE | 32a_k+1 | 34aU_k+1 | | | |
| | 32b_k+1 | 34bU_k+1 | | | |

SOLID-STATE IMAGING DEVICE, IMAGING DEVICE AND DRIVING METHOD OF SOLID-STATE IMAGING DEVICE

The present application contains subject matter related to that disclosed in Japanese Priority Patent Application JP 2008-142336 filed in the Japan Patent Office on May 30, 2008, the entire content of which is hereby incorporated by reference.

BACKGROUND OF THE INVENTION

1. Field of the Invention

The present invention relates to a solid-state imaging device, an imaging device and a driving method of the solid-state imaging device. More particularly, the present invention relates to a pixel driving technique suitable for semiconductor devices such as solid-state imaging devices for detecting physical quantity distribution and other electronic equipment which include an arrangement of a plurality of unit pixels sensitive to externally fed electromagnetic waves such as light and radiation, and from which a physical quantity distribution, converted into an electric signal by unit components, can be read out in the form of an electric signal through arbitrary selection by address control.

2. Description of the Related Art

Semiconductor devices for detecting physical quantity distribution have found wide application in a variety of fields. Such devices have a plurality of unit components (e.g., pixels), sensitive to externally fed electromagnetic waves such as light and radiation, arranged in lines or in a matrix form.

In the field of video equipment, for example, CCD (Charge Coupled Device) or MOS (Metal Oxide Semiconductor) and CMOS (Complementary Metal Oxide Semiconductor) solid-state imaging devices are used. These devices are designed to detect light (an example of electromagnetic waves) among other physical quantities. Such devices allow a physical quantity distribution, converted into an electric signal by unit components (pixels in a solid-state imaging device), to be read out therefrom in the form of an electric signal.

Some solid-state imaging devices are amplifying devices. These devices include, in a pixel signal generation section, pixels configured as solid-state imaging elements (APSs: Active Pixel Sensors, also referred to as gain cells), each of which has an amplifying drive transistor. The pixel signal generation section generates a pixel signal commensurate with the charge of the signal generated by a charge generation section. For example, many of CMOS solid-state imaging devices are configured in such a manner.

In order to read out a pixel signal externally from such an amplifying solid-state imaging device, a pixel section having an arrangement of a plurality of unit pixels is address-controlled so that the signal from a unit pixel can be arbitrarily selected and read out. That is, an amplifying solid-state imaging device is an example of address-controlled solid-state imaging device.

In an X-Y address solid-state imaging device having unit pixels arranged in a matrix form, MOS transistors serve as active elements such as switching elements adapted to select pixels and read out signal charges. Further, MOS transistors are used in horizontal and vertical scan circuits, offering an advantage in that both the switching elements and pixel section can be manufactured in a series of steps.

A unit pixel includes a charge generation section and signal output section. The charge generation section generates a signal charge. The signal output section has a transistor adapted to generate and output a target signal which is commensurate with the signal charge generated by the charge generation section. For example, the charge generation section has a photodiode which performs photoelectric conversion. The signal output section has a readout selection transistor, amplifying transistor, reset transistor and selection transistor. The readout selection transistor reads out the signal charge generated by the photodiode. The amplifying transistor converts the read signal charge into a pixel signal. The reset transistor resets the signal charge. The selection transistor selects the pixel to be read out. The signal charge (photoelectron or hole) accumulated in the photodiode, a photoelectric conversion element, is amplified by the active elements of the signal generation section and read out as image information.

Incidentally, electronic exposure time control is performed in this type of solid-state imaging device. In the imaging device, the pixel section includes a number of pixel transistors arranged two-dimensionally in a matrix form. The accumulation of signal charge associated with incident light begins on a pixel-by-pixel or line (row)-by-line (row) basis. The current or voltage signals based on the accumulated signal charge are read in order from the pixels in a imaging section through address specification. In a broad sense, this is called electronic shutter function. Here, a pixel signal is read out from the pixel section on a row-by-row basis by accessing a row of pixels at the same time. This example of address control (hereinafter referred to as row-by-row readout or column readout scheme) is common in a MOS (including CMOS) solid-state imaging device.

It should be noted that, in some X-Y address solid-state imaging devices, unnecessary signal charge of a row of pixels is reset (discharged to a signal line), for example, during a horizontal blanking period in which no signal charge is read out, in order to achieve an electronic shutter function in a narrow sense. This electronic shutter function electronically specifies an exposure time different from a normal exposure time.

In an X-Y address solid-state imaging device, the time corresponding to the exposure time for the electronic shutter speed, i.e., the pixel accumulation time, is determined by the period of time from the discharge to the readout of the signal charge. Therefore, the accumulation and sequential readout scheme is used which reads out a pixel signal every pixel exposure time (accumulation frame time).

For example, when a CMOS solid-state imaging device is used, a pixel generally begins again, according to its operation principle, to accumulate signal charge obtained through photoelectric conversion from the moment when it outputs a signal. Therefore, the accumulation period deviates according to the scan timing of the imaging surface. That is, the accumulation time deviates by scan time from one scan line to another, resulting in so-called line exposure. Unlike a CCD (charge-coupled device) solid-state imaging device, global exposure is not used. Global exposure reads out the signal charges simultaneously from all the pixels to the vertical CCD by accumulating incident light on the photoelectric conversion elements during the same time period in the form of signal charges, thus satisfying the simultaneity condition for accumulation. Because a drive pulse is supplied row by row, line exposure (also referred to as rolling shutter or focal plane accumulation) is used in a CMOS solid-state imaging device, which is a significant difference from its CCD counterpart based on the accumulation and simultaneous readout scheme, that is, global exposure.

When the shutter speed is slow and a sufficiently long pixel accumulation time is specified, the deviation in accumulation period is negligible. However, if the shutter speed is fast and not much different from the horizontal scan period, the difference in accumulation period gives rise to time shading distortion in the line direction (row direction or horizontal scan direction) due to the horizontal motion of the object and the difference in scan time (accumulation period). Time shading distortion manifests itself in the form of a motion distortion on the image.

SUMMARY OF THE INVENTION

One possible solution to this problem would be to use mechanical shutter in combination with electronic shutter during capture of a still image. Another possible solution would be to use an arrangement adapted to achieve the global shutter function so that the exposure/accumulation time during electronic shutter operation is constant between different pixels (so that the pixels are exposed simultaneously).

However, it is difficult to use mechanical shutter in combination with electronic shutter during capture of a moving image. Further, the common global shutter function currently under consideration holds up to one frame of charge after the signal charge is accumulated in the charge accumulation section (e.g., floating fusion), thus resulting in characteristic degradation due to dark current noise.

Interlaced scan as used for video signals of the analog broadcast waves would be a possible way to handle moving image capture without dark current noise caused by global shutter in order to improve motion distortion associated with line exposure. For example, an interline transfer CCD can be driven in two ways, frame accumulation and field accumulation.

Interlaced scan by frame accumulation transfers only the signal charges of the charge generation sections in odd rows to the vertical CCD during an odd field, and transfers only those in even rows to the same CCD during an even field. For an odd field consisting of only odd rows and an even field consisting of only even ones, the accumulation time of each of the charge generation sections is a frame period. As a result, imaging a fast-moving subject leads to an image full of frame afterimages.

In contrast, interlaced scan by field accumulation simultaneously transfers the signal charges of the charge generation sections in odd rows and their next even rows to the vertical CCD for addition and readout during an odd field, and then changes the combination of the charges of the charge generation sections to be added during a next even field, simultaneously transferring the signal charges of the charge generation sections in even rows and their next odd rows to the vertical CCD for addition and readout. The signal charges of the charge generation sections for all the pixels are read out on a field-by-field basis. For each field, the accumulation time of each of the charge generation sections is a field period (i.e., half the frame period). This provides an image with minimal frame afterimages even when a fast-moving subject is imaged. Therefore, using a driving method equivalent to this field accumulation for an interline transfer CCD for X-Y address solid-state imaging devices such as CMOS solid-state imaging device will probably contribute to improvement in distortion associated with line exposure.

However, interlaced scan equivalent to field accumulation for an interline transfer CCD cannot be performed in a common CMOS solid-state imaging device. The reason for this is that the signal charges of the charge generation sections in a plurality of rows (normally upper and lower pixels in the case of two fields per frame) must be added together. Further, the combination of charge generation sections to be added varies from one field to another. In the case of a CCD solid-state imaging device, the vertical CCD can add together the signals in the form of charge even in the event of a variation in the combination of charge generation sections to be added. For a common CMOS solid-state imaging device, on the other hand, the charge generation sections and pixel signal generation sections are in a one-to-one relationship, thus making the addition of signals in the form of charge impossible.

A possible countermeasure against the above would be to provide an in-pixel memory adapted to hold a signal charge (refer to Japanese Patent Laid-Open No. 2007-150008 (Patent Document 1) and Japanese Patent Laid-Open No. Hei 06-334920 (Patent Document 2)). However, this leads to detriments including increased chip area and smaller saturation signal level.

For example, Patent Document 1 proposes an arrangement which allows for addition of signals using floating diffusions. In order for this structure to provide interlaced scan, however, all floating diffusions in the column direction must be shared, resulting in increased parasitic capacitance of the floating diffusions. This leads to significantly reduced conversion efficiency, making this proposal unpractical. Further, charge storage sections are provided in the pixel array section separately from the floating diffusions. This reduces the size of the charge generation sections because of the charge storage sections, resulting in reduced saturation signal level.

Patent Document 2, on the other hand, proposes a structure which connects the upper and lower pixels together with a MOS transistor to allow for signal addition in the form of charges. However, this structure leads to twice the capacitance, eventually causing the averaging of the voltages.

The present invention has been made in light of the foregoing problems, and it is desirable to provide an arrangement which can suppress image motion distortion associated with line exposure using interlaced scan without causing increased chip size or reduced saturation signal level.

First, the present invention includes a pixel array section. The pixel array section includes unit pixels arranged two-dimensionally in a matrix form. Each of the unit pixels includes a charge generation section, charge transfer sections and signal output section. The charge generation section generates a signal charge. The charge transfer sections transfer the signal charge generated by the charge generation section. The signal output section generates and outputs a target signal commensurate with the charge of the signal generated by the charge generation section.

The plurality of charge transfer sections are provided for each of the charge generation sections.

In addition, in an embodiment of the present invention, the plurality of charge transfer sections, provided for each of the charge generation sections, are connected, on the side opposite to the charge generation section, to the signal output sections in different rows. Each of the charge generation sections can be connected to the signal output sections in different rows via the plurality of charge transfer sections.

In another embodiment of the present invention which views the above from a different standpoint, the signal output section in each row can switch between two operations, one adapted to receive a signal charge from the charge generation section in one of the rows through selective ON/OFF operations of the plurality of charge transfer sections, and another adapted to receive a signal charge from the charge generation section in its own row to which the signal output section belongs or from the one in a row other than its own row.

The plurality of charge transfer sections are provided for each of the charge generation sections. The charge transfer sections are connected to the signal output sections in different rows. This allows for interlaced scan involving addition of signal charges of the plurality of charge generation sections. The charge generation sections in different rows are combined for addition every field. Interlaced scan is made possible by selective ON/OFF operations of the plurality of charge transfer sections (operations by which only one of the charge transfer sections is activated). This allows for interlaced scan which reads out the signal charges of the charge generation sections for all the pixels. Naturally, progressive scan similar to that for image acquisition by a common CMOS sensor is also possible.

A solid-state imaging device to which the above arrangement is applied may be in the form of a single chip or a module having a pixel array section (imaging section) and signal processing section or optical system packaged together. Further, the above arrangement is also applicable to not only a solid-state imaging device but also an imaging device. In this case, the imaging device provides the same advantageous effects as the solid-state imaging device. Here, the imaging device refers, for example, to a camera (or camera system). On the other hand, the term "imaging" includes not only image capture during normal camera photography but also, in a board sense, fingerprint detection and others.

An embodiment of the present invention has a plurality of charge transfer sections provided for each charge generation section, thus allowing for connection of each of the charge generation sections to a signal output section in a different row. This makes it possible for the signal output section to add together the signal charges by selecting the charge transfer section to be activated to match interlaced scan.

Interlaced scan reads out the signal charges of the charge generation sections for all the pixels on a field-by-field basis, thus suppressing image motion distortion associated with line exposure. Further, there is no need for charge accumulation sections for addition purposes other than the existing ones, preventing increased chip area, reduced conversion efficiency and reduced saturation signal level and providing improved S/N ratio thanks to signal charge addition.

BRIEF DESCRIPTION OF THE DRAWINGS

FIGS. 4A to 4C are diagrams 3 describing the electronic shutter function of an X-Y address imaging device;

FIG. 5 is a diagram describing a pixel array section as a comparative example;

FIG. 7 is a diagram describing the combinations of charge generation sections and pixel transistors for interlaced scan in the first embodiment;

FIGS. 12A-1 to 12B-2 are diagrams describing the effect of alleviating time shading distortion associated with line exposure thanks to interlaced scan;

FIG. 13 is a diagram describing the combinations of charge generation section and pixel transistors for progressive scan in the first embodiment;

FIG. 16 is a diagram describing the pixel array section according to a second embodiment;

FIG. 17 is a diagram describing the pixel array section according to a third embodiment;

FIGS. 18A and 18B are diagrams describing the combinations of charge generation sections and pixel transistors for interlaced and progressive scan in the third embodiment;

FIG. 24 is a diagram describing the pixel array section according to a fifth embodiment;

FIGS. 25A and 25B are diagrams describing the combinations of charge generation sections and pixel transistors for interlaced and progressive scan in the fifth embodiment;

FIGS. 30A and 30B are diagrams describing the combinations of charge generation sections and pixel transistors for interlaced and progressive scan in the sixth embodiment;

DETAILED DESCRIPTION OF THE PREFERRED EMBODIMENTS

Figure 1:
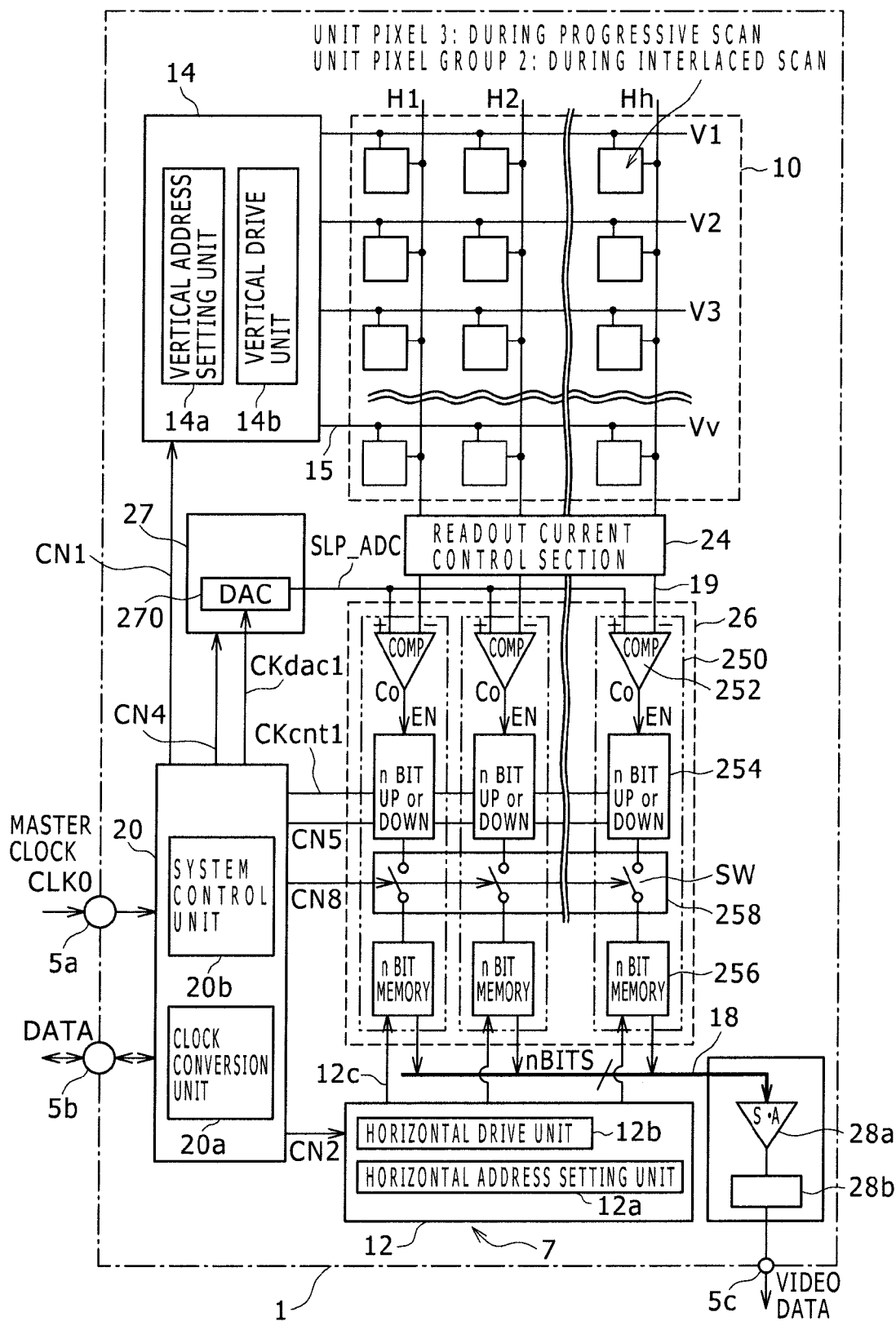
FIG. 1 is a basic configuration diagram of a CMOS solid-state imaging device (CMOS image sensor) which is an embodiment of a solid-state imaging device.

The preferred embodiments of the present invention will be described below with reference to the accompanying drawings. Where distinction is made between the functional elements of the different embodiments, such elements will be denoted by reference numerals such as capital letters A, B, C and so on. Where no particular distinction is made therebetween for description, such reference numerals will be omitted. The same holds true for the drawings.

It should be noted that a case will be described below in which a CMOS solid-state imaging device, an example of X-Y address solid-state imaging device, is used as a device. Further, unless otherwise specified, the following descriptions will be given assuming that all the unit pixels of the CMOS solid-state imaging device include NMOS (n-channel MOS) transistors and that the signal charges are negative (electrons). However, this is merely an example, and the target devices are not limited to MOS solid-state imaging devices. The unit pixels may include PMOS (p-channel MOS) transistors. The signal charges may be positive (holes). All the embodiments described later are similarly applicable to all semiconductor devices for detecting physical quantity distribution and other electronic equipment which include a liner or matrix arrangement of a plurality of unit pixels sensitive to externally fed electromagnetic waves such as light and radiation, and from which a physical quantity distribution, converted into an electric signal by unit components, can be read out in the form of an electric signal with an arbitrary selection through address control.

Solid-State Imaging Device

Basic Configuration

FIG. 1 is a basic configuration diagram of a CMOS solid-state imaging device (CMOS image sensor) which is an embodiment of a solid-state imaging device according to the present invention.

A solid-state imaging device 1 has a pixel array section 10 which includes a plurality of unit pixels 3 arranged two-dimensionally in a matrix form. The device 1 can render the pixel array section 10 capable of color imaging by using, for example, a color separation filter having R, G and B color filters arranged in a Bayer pattern.

Although, in FIG. 1, some rows and columns are omitted for simplification, several tens to thousands of the unit pixels 3 are practically provided for each of the rows and columns. As described later, the unit pixels 3 each have, for example, in addition to a photodiode serving as a photoreceiving element (charge generation section) which is an example of a detection section, an in-pixel amplifier which includes three to four transistors for charge transfer, reset and amplification purposes. The unit pixels 3 output a pixel signal voltage Vx via a vertical signal line 19 on a column-by-column basis. The pixel signal voltage Vx contains a reset level Srst (P-phase component) and a signal level Ssig (D-phase component).

The solid-state imaging device 1 further has a column AD conversion section 26. The section 26 has AD conversion sections 250 arranged in a column-parallel manner. The AD conversion sections 250 handle CDS (Correlated Double Sampling) processing and digital conversion. The term "column-parallel" refers to the fact that a plurality of CDS processing function sections, digital conversion function sections (AD conversion sections) and other sections are provided in parallel for each of the vertical signal lines 19 (an example of column signal lines) in vertical columns. Such a readout scheme is called column readout scheme.

The solid-state imaging device 1 still further includes a drive control section 7, readout current control section 24, reference signal generation section 27 and output section 28. The readout current control section 24 supplies an operating current (readout current) for reading out the pixel signal to the unit pixels 3. The reference signal generation section 27 supplies a reference signal SLP_ADC for AD conversion to the column AD conversion section 26.

The drive control section 7 includes a horizontal scan section 12 (column scan circuit), vertical scan section 14 (row scan circuit) and communication/timing control section 20 to provide control circuit functions for sequential readout of the signals from the pixel array section 10.

The horizontal scan section 12 has a horizontal address setting unit 12a, horizontal drive unit 12b and other sections. The horizontal address setting unit 12a controls the column addresses and column scan. The vertical scan section 14 has a vertical address setting unit 14a, vertical drive unit 14b and other sections. The vertical address setting unit 14a controls the row addresses and row scan. The horizontal and vertical scan sections 12 and 14 begin their row and column selections (scans) in response to control signals CN1 and CN2 supplied from the communication/timing control section 20.

The section 20 includes a timing generator (an example of readout address control device) functional block. This functional block supplies a clock, which is synchronous with a master clock CLK0 fed via a terminal 5a, to various sections (such as the horizontal scan section 12, vertical scan section 14 and column AD conversion section 26) of the device. The same section 20 further includes a communication interface functional block. This functional block receives the master clock CLK0 from an external main control section via the terminal 5a. The same functional block further receives data adapted to specify, for example, the operation mode to be used, from the external main control section via a terminal 5b. This functional block also outputs, to the external main control section, the data containing information about the solid-state imaging device 1.

For example, the communication/timing control section 20 has a clock conversion unit 20a and system control unit 20b and other units. The clock conversion unit 20a has a clock conversion function adapted to generate an internal clock. The system control unit 20b controls not only the communication function but also various sections. The clock conversion unit 20a incorporates a frequency multiplier adapted to generate pulses higher in frequency than the master clock CLK0 fed via the terminal 5a based on this clock, generating internal clocks such as count clocks CKcnt1 and CKdac1.

The output section 28 has a sense amplifier 28a (S·A) and interface section 28b (IF section). The sense amplifier 28a detects the signal (small in amplitude although being digital) on a horizontal signal line 18. The interface section 28b handles interfacing between the solid-state imaging device 1 and external equipment. The output of the interface section 28 is connected to an output terminal 5c so that video data is output to the circuit at the subsequent stage. The output section 28 may have a digital operation section between the sense amplifier 28a and interface section 28b to handle various types of digital operations.

The unit pixels 3 are each connected to the vertical scan section 14 via a row control line 15 adapted to select rows and to one of the AD conversion sections 250 provided one for each of the vertical columns of the column AD conversion section 26 via the vertical signal line 19. Here, the row control lines 15 refer to wirings in general coming from the vertical scan section 14 and going into the pixels.

The vertical scan section 14 selects rows of the pixel array section 10 and supplies a necessary pulse to those rows. The vertical address setting unit 14a selects not only the rows from which to read out signals (readout rows: also referred to as selected rows or signal output rows) but also rows for electronic shutter.

Here, an X-Y address solid-state imaging device such as the solid-state imaging device 1 uses the accumulation and sequential readout scheme. This scheme reads out a pixel signal every accumulation frame time of each of area elements. In such a device, a drive pulse is supplied row by row. As a result, line exposure (also referred to as rolling shutter or focal plane accumulation) is used which accumulates and reads out charges on a row-by-row basis. This is a significant difference from its CCD counterpart using the accumulation and simultaneous readout scheme, that is, global exposure. Global exposure reads out the signal charges simultaneously from all the pixels to the vertical CCD by accumulating incident light on the photoelectric conversion elements during the same time period in the form of signal charges, thus satisfying the simultaneity condition for accumulation.

In the electronic shutter operation of this line exposure scheme, the exposure time is from when a given readout row is specified as the row for shutter operation (shutter operation row) and the photoelectric conversion element (detection section) making up the unit pixel 3 is reset to when that readout row is specified as the row for readout operation (readout operation row) and the signal charge is actually read out to the vertical signal line 19.

Although a detailed description will be given later, this line exposure scheme is problematic in that capture of a moving subject leads to a large time shading distortion. As a countermeasure against this problem, the present embodiment performs interlaced scan rather than progressive scan. During interlaced scan, unit pixel groups 2 are formed. In each of the unit pixel groups 2, a plurality of charge generation sections share a single pixel signal generation section. The signal charges generated by the plurality of charge generation sections are added together by the pixel signal generation section. The resultant target signal is read out into the column AD conversion section 26.

Various AD conversion schemes are possible for use in the AD conversion sections 250 from the viewpoint of circuit scale, processing speed (speed enhancement), resolution and other factors. As an example, an AD conversion scheme, which is called the reference signal comparison, slope integrating or ramp signal comparison AD conversion scheme, is used. In the reference signal comparison AD conversion, the effective period for the counting operation is determined based on the time from the start (start of the comparison) to end (end of the comparison) of the conversion. The analog target signal is converted into digital data based on a count enable signal EN which indicates the effective period.

Therefore, the reference signal generation section 27 has a DA conversion section 270 (DAC: Digital Analog Converter), generating the reference signal SLP_ADC of the slope (rate of change) indicated by control data CN4 from the communication/timing control section 20. The section 270 generates the reference signal from the initial value indicated by the control data CN4 from the communication/timing control section 20, in synchronism with the count clock CKdac1. The count clock CKdac1 may be the same as the count clock CKcnt1 for a counter section 254.

The AD conversion sections 250 each include a comparison section 252 (COMP) and a counter section 254 which can be switched between up-count and down-count modes. In this example, each of the sections 250 further includes a switch section 258 and data storage section 256 at the subsequent stage of the counter section 254. The comparison section 252 compares the reference signal SLP_ADC, generated by the reference signal generation section 27, with the analog pixel signal voltage Vx obtained from the unit pixels 3 in the selected rows via the vertical signal line 19 (H1, H2, ..., Hh). The counter section 254 counts the active duration of the count enable signal EN with the count clock CKcnt1 and holds the count result. The count enable signal EN has a constant relationship with a comparison output Co of the comparison section 252.

The communication/timing control section 20 supplies a control signal CN5 to the counter section 254 of each of the AD conversion sections 250. The control signal specifies control information. Such control information includes whether the counter section 254 operates in down-count or up-count mode to count P- and D-phases. Such control information also includes the setting and resetting of an initial value Dini for the counting of P-phases and other information.

The input terminal (+), one of the two terminals of each of the comparison sections 252, is supplied with the reference signal SLP_ADC generated by the reference signal generation section 27, together with the other input terminals (+). The input terminal (−), the other of the two terminals thereof, is connected to the associated one of the vertical signal lines 19 arranged in vertical columns and supplied with the pixel signal voltage Vx from the pixel array section 10.

The clock terminal CK of the counter section 254, together with the other clock terminals CK, are supplied with the count clock CKcnt1 from the communication/timing control section 20. If the data storage section 256 is not provided, the counter section 254, together with the other counter sections 254, are supplied with a control pulse from the horizontal scan section 12 via a control line 12c. Each of the counter sections 254 has a latching function to hold the count result and holds the count output value until instructed by the control pulse supplied via the control line 12c.

In the present embodiment, the CDS processing is completed by the AD conversion sections 250. However, P-phase data at the reset level Srst and D-phase data at the signal level Ssig may be transferred separately to the output section 28 so that CDS processing is handled by the digital operation sections provided at the subsequent stage of the AD conversion sections 250. The present applicant has proposed various reference signal comparison AD conversion schemes adapted to perform AD conversion and CDS processing using the AD conversion sections 250, and these schemes can be basically used in all the embodiments.

The solid-state imaging device 1 according to the present embodiment is configured in the form of a single-chip device (provided on the same semiconductor substrate) in which the respective components of the drive control section 7 such as the horizontal and vertical scan sections 12 and 14 are formed integrally with the pixel array section 10 in a single crystal silicon or other semiconductor region using the same technique as the semiconductor integrated circuit manufacturing technique.

The solid-state imaging device 1 may be in the form of a single chip with its components formed integrally in the semiconductor region as described above. Alternatively, however, the device 1 may be in the form of an imaging-capable module having, in addition to the pixel array section 10, drive control section 7, column AD conversion section 26 and other signal processing sections, an optical system such as an imaging lens, optical low-pass filter or infrared cutting filter packaged together, although the illustration thereof is omitted.

As the output side of each of the AD conversion sections 250, the output of the counter section 254, for example, may be connected to the horizontal signal line 18. Alternatively, the data storage section 256 serving as a memory and the switch section 258 may be provided at the subsequent stage of the counter section 254 as illustrated in FIG. 1. The counter section 254 has a latching function to hold the count result of the counter section 254. The switch section 258 is provided between the counter section 254 and data storage section 256. The switch section 258 has a switch SW for each of the vertical columns.

In the configuration including the data storage sections 256, the switch SW, together with other switches SW along the vertical columns, are supplied with a memory transfer instruction pulse CN8 as a control pulse at a predetermined timing from the communication/timing control section 20. When supplied with the memory transfer instruction pulse CN8, the switches SW of the switch section 258 transfer the counter values of the associated counter sections 254 to the data storage sections 256. The data storage sections 256 hold and store the transferred count values. The sections 256 are supplied with a control pulse from the horizontal scan section 12 via the control line 12c. The same sections 256 hold the counter values from the counter sections 254 until instructed by the control pulse supplied via the control line 12c.

The horizontal scan section 12 is capable of serving as a readout scan section, reading out the count values from the data storage sections 256 in parallel with the processing handled by the comparison sections 252 and counter sections 254 of the column AD conversion section 26. The outputs of the data storage sections 256 are connected to the horizontal signal lines 18. The horizontal signal lines 18 are each as wide or twice as wide (e.g., for complementary output) as the bit width of the AD conversion section 250. The same lines 18 are connected to the output section 28 having the sense amplifiers 28a associated with the output lines. It should be noted that the counter sections 254, data storage sections 256, switch section 258 and horizontal signal lines 18 are each configured to handle n bits.

Exposure Time Control Function

Figure 2:
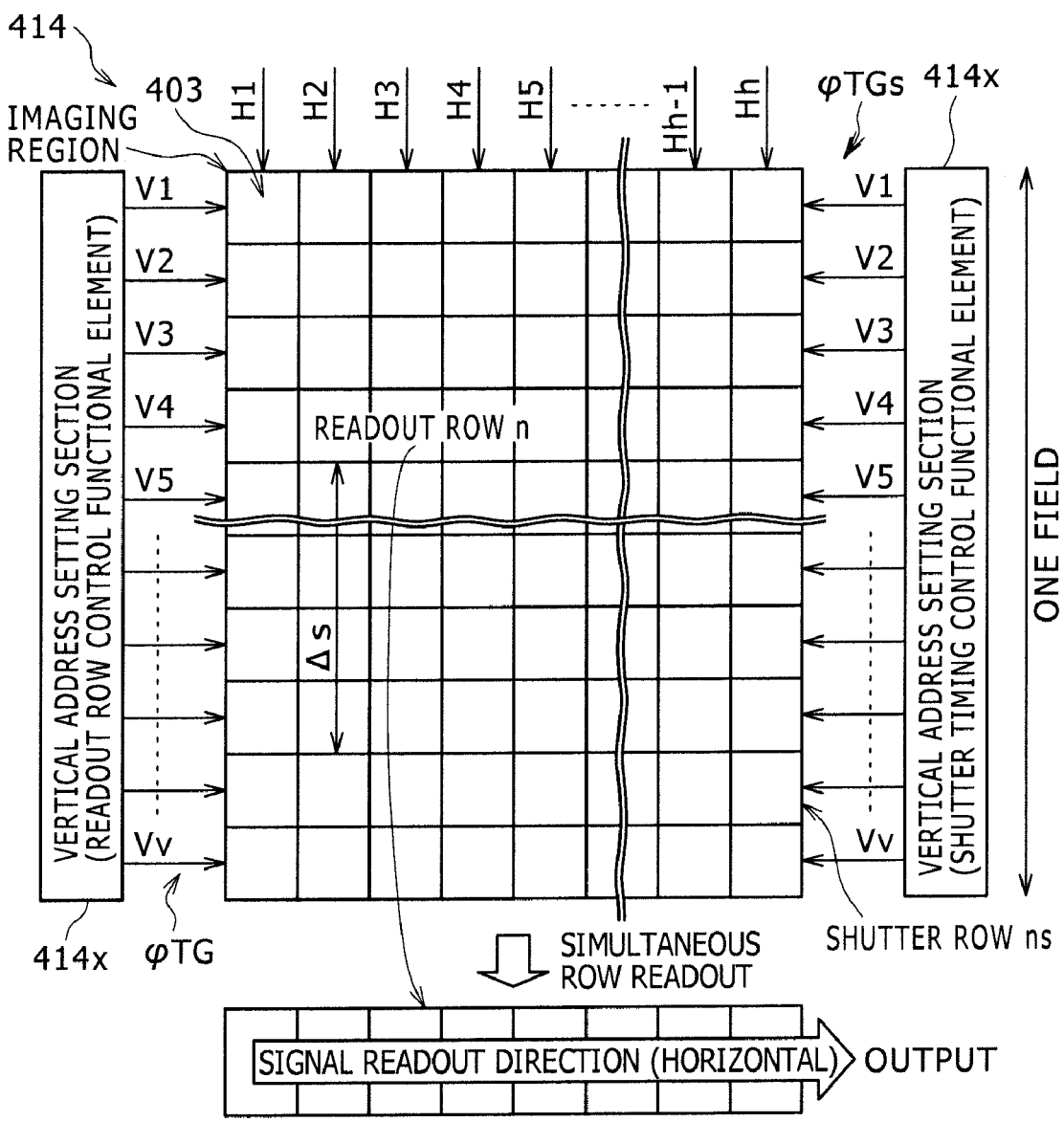
FIG. 2 is a diagram 1 describing an electronic shutter function of an X-Y address imaging device.
Figure 3A:
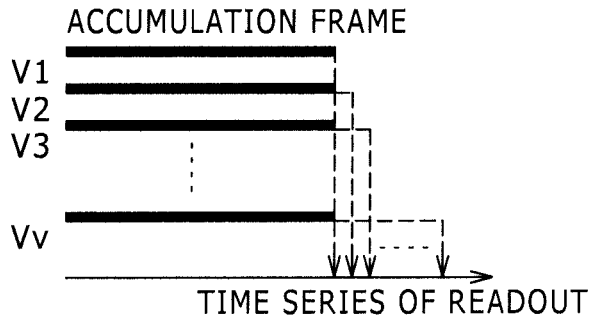
FIGS. 3A to 3C are diagrams 2 describing the electronic shutter function of an X-Y address imaging device.
Figure 3B:
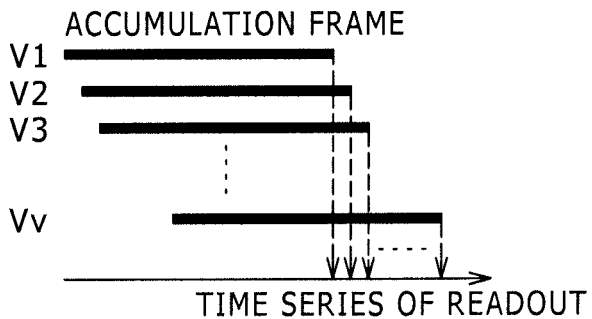
Figure 3C:
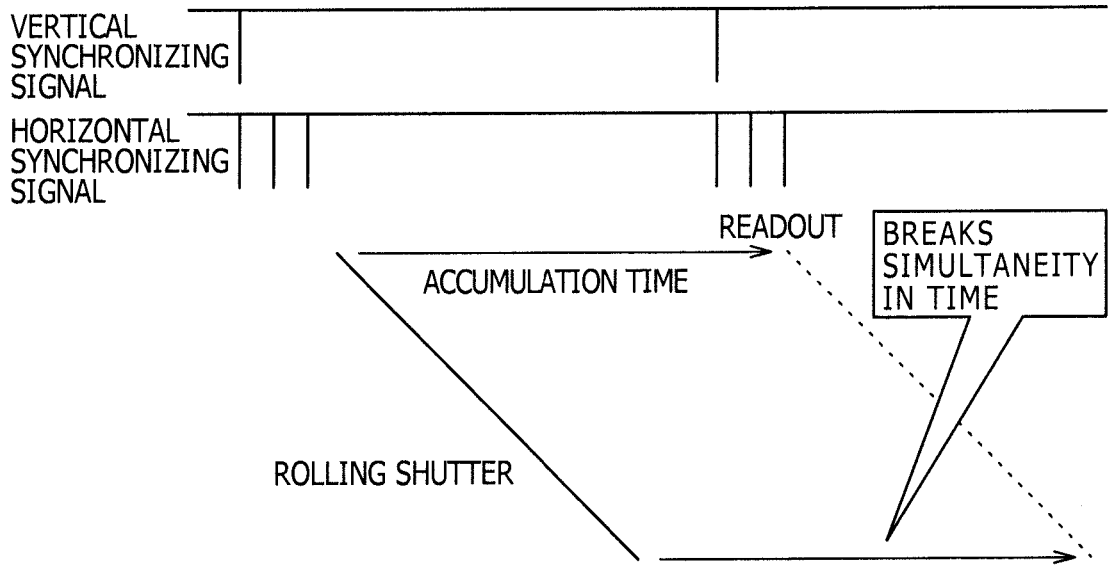

FIGS. 2 to 4C are diagrams describing an exposure control (electronic shutter) function of a common X-Y address imaging device. As illustrated in FIG. 2, a vertical address setting section 414x of a vertical scan section 414 is capable of not only specifying row addresses φTG to be read out, which is a normal function, but also generating address information specifying row addresses of unit pixels 403 to be shuttered (shutter pixels), namely, shutter pixel positions (more specifically, transfer gate pulse TGs serving as a drive pulse).

It should be noted that, in some X-Y address solid-state imaging devices, unnecessary signal charge of a row of pixels is reset (discharged to a signal line), for example, during a horizontal blanking period in which no signal charge is read out in order to achieve an electronic shutter function in a narrow sense. This electronic shutter function electronically specifies an exposure time different from a normal exposure time.

Here, in an X-Y address solid-state imaging device, the time corresponding to the exposure time for the electronic shutter speed, i.e., the pixel accumulation time, is determined by the period of time from the discharge to the readout of the signal charge. Therefore, the accumulation and sequential readout scheme is used which reads out a pixel signal every pixel exposure time (accumulation frame time). This leads to a time difference in the exposure of the pixels arranged across the surface. If such a readout scheme is used, a motion of the subject gives rise to a deviation in time required to capture light between different pixels, thus resulting in motion distortion. The accumulation and sequential readout scheme is significantly different in this regard from the accumulation and simultaneous readout scheme. The latter scheme, employed by charge-coupled imaging elements, holds the signals to delay their transfer, thus allowing for simultaneous exposure of all the pixels and preventing "motion distortion" on a single screen.

For example, the column readout scheme (row-by-row readout scheme) causes the accumulation period to deviate by the scan time from one horizontal scan line to another, thus resulting in a difference in accumulation time between left and right in the horizontal direction depending on the rows (horizontal scan lines). This leads to time shading distortion (motion distortion) which causes a fast-moving subject to be imaged in a distorted manner.

That is, wirings are arranged so that a drive pulse φTGs is supplied to all the unit pixels 403 in the same row from the shutter timing control functional element of the vertical address setting section 414x. The drive pulse φTGs specifies the addresses of the rows to be shuttered. This allows for the unit pixels 403 in the rows specified by the drive pulse φTGs to be specified as the shutter pixels.

When a CMOS solid-state imaging device is used, a pixel generally begins again, according to its operation principle, to accumulate signal charge obtained through photoelectric conversion from the moment when it outputs a signal. Therefore, the accumulation period deviates according to the scan timing of the imaging surface. That is, the accumulation time deviates by scan time from one scan line to another, resulting in so-called line exposure. Unlike a CCD (charge-coupled device) solid-state imaging device, global exposure is not used. Global exposure reads out the signal charges simultaneously from all the pixels to the vertical CCD by accumulating incident light on the photoelectric conversion elements during the same time period in the form of signal charges, thus satisfying the simultaneity condition for accumulation.

Here, a case is considered in which a readout row n and shutter row ns are separated from each other by Δs rows in the imaging area, as illustrated in FIG. 2. The pixels in the target columns along the row ns instructed to be electronically shuttered begin signal charge accumulation again after being reset. Therefore, if the imaging surface is scanned from top to bottom, the time difference between the row n and row n+Δs has a given relationship with the frame rate and scan line count. As a result, by adjusting the spacing between the readout row n and shutter row ns, the accumulation time of charges read out from the CMOS solid-state imaging device can be changed. This adjustment can be made in units of a line period (one horizontal scan period).

An existing CMOS sensor performs electronic shutter control on a row-by-row basis, using the single readout row n and single shutter row ns for imaging of a screen. The shutter timing control functional element of the vertical address setting section 414x specifies the shutter row ns for the pixels in all columns (H1, H2, . . . , Hh) in the readout row n which is specified by the same section 414x at a given point in time. The shutter row ns is any row other than the readout row n, that is, separated in position (time) from the readout row n by Δs rows. In this condition, the shutter timing control functional element resets the pixels. This reset operation can be accomplished by discharging the charges from the photoelectric conversion elements prior to the shutter timing. In the case of a CMOS solid-state imaging device, the reset operation can be accomplished by turning ON the transfer and reset gates.

The period of time until the pixels in the shutter row ns are specified as the readout row n by the vertical address setting section 414x is the accumulation time. That is, the time interval between the readout row n and shutter row ns is the accumulation time. This eventually provides control over the accumulation time on a row-by-row basis. When a normal accumulation time (exposure time) is specified, the shutter row ns will not be accessed. In this case, charge will be accumulated only for a period of time equal to the frame rate.

As described above, the features of line exposure performed by a CMOS solid-state imaging device are taken advantage of, supplying the drive pulse φTGs for electronic shutter to the unit pixels 403 on a row-by-row basis. This makes it possible to specify the time difference between the readout row n and shutter row n+Δs for the unit pixels 403 on a row-by-row basis, thus permitting ready control over the accumulation time row by row.

It should be noted, however, that, here, an X-Y address solid-state imaging device uses the accumulation and sequential readout scheme, as described earlier. This scheme reads out a pixel signal every accumulation frame time of each of area elements. In such a device, the drive pulse φTGs is supplied row by row. As a result, line exposure (also referred to as rolling shutter or focal plane accumulation) (refer to FIGS. 3B and 3C) is used. This is a significant difference from its CCD counterpart based on the accumulation and simultaneous readout scheme, that is, global exposure (refer to FIG. 3A).

When the shutter speed is slow and a sufficiently long pixel accumulation time is specified, the deviation in accumulation period is negligible. However, if the shutter speed is fast and not much different from the horizontal scan period, the difference in accumulation period gives rise to time shading distortion in the line direction (row direction or horizontal scan direction) due to the horizontal motion of the object and the difference in scan time (accumulation period) (refer to FIG. 4B). Time shading distortion manifests itself in the form of a motion distortion on the image (refer to FIG. 4C).

A possible solution to this problem would be interlaced scan. In interlaced scan, a plurality of pixels must be added together, and the combination of pixels to be added together varies from one field to another. In the case of a CCD solid-state imaging device, the vertical register can add together the signals in the form of charges even in the event of a variation in the combination of pixels to be added. For a common CMOS solid-state imaging device, on the other hand, charge generation sections 32 and pixel signal generation sections 5 are in a one-to-one relationship, thus making the addition of signals in the form of charge impossible.

For this reason, the present embodiment employs a new arrangement to contribute to improvement in time shading distortion in the line direction which is caused by the difference in accumulation period due to line exposure and which manifests itself in the form of a motion distortion on the image.

In order to achieve this arrangement, first of all, the pixel array section 10 has a plurality of readout selection transistors 34 provided for each charge generation section 32 as charge transfer sections (transfer gates). These are connected respectively to pixel signal generation sections 5 (excluding the readout selection transistors 34), i.e., signal output sections 6 in different rows. The plurality of readout selection transistors 34 provided for the same charge generation section 32 can be selectively turned ON or OFF. The vertical scan section 14 controls these transistors so that only one of them is active during transfer of a signal charge. The section 14 selectively uses the rows of the plurality of readout selection transistors 34 to ensure that the imaging device supports both progressive and interlaced scan.

During interlaced scan, the unit pixel groups 2 are formed. In each of the unit pixel groups 2, a plurality of charge generation sections 32 share the single pixel signal generation section 5. The signal charges generated by the plurality of charge generation sections 32 are added together by the pixel signal generation section 5, after which the resultant target signal is read out. This arrangement is a driving method equivalent to field accumulation for an interline transfer CCD and referred to as interlaced scan in combination with charge addition. Although, in the description of the embodiments given later, the term "in combination with charge addition" may be omitted, all interlaced scan is performed in combination with charge addition.

Progressive scan reads out target signals sequentially from the signal output sections 6 of the vertical scan lines (rows of the pixel signal generation section 5 or signal output sections 6 in the present embodiment) for a screen (frame). Interlaced scan splits one screen into N images (N fields) by reading every N scan lines of the screen. In other words, interlaced scan reads out screens (fields), each having 1/N scan lines at different positions, in N steps. In interlaced scan in combination with charge addition, each field image has a vertical resolution 1/N times that of progressive scan. Further, there is a time difference between fields. However, the number of screens per second is N times larger than that in progressive scan. The charge accumulation time is 1/N times that of progressive scan. This allows for smooth rendering of a moving subject, thus contributing to improved time resolution. Thus, interlaced scan in combination with charge addition offers an advantage in that it can alleviate time shading distortion associated with line exposure and prevent degradation of the smooth motion in the moving image. It should be noted that this does not mean to deny interlaced scan to capture a still image. In this case, however, each field has a time difference. Therefore, imaging a moving subject leads to a blur.

A detailed description will be given below. It should be noted that the term "one field period" refers to the period of time (more specifically vertical scan period) during which the imaging surface is two-dimensionally scanned to read out an image. The term "one field period" refers to the period of time during which an image is formed with all the pixels on the imaging surface. In progressive scan adapted to sequentially scan all the rows in the vertical direction, "one field period" is equal to "one frame period." In contrast, in interlaced scan which skips some rows during a first vertical scan and scans the skipped rows during a second vertical scan to complement the first one, "K fields" are equal to "one frame." "K" varies depending on the manner in which rows are skipped. Normally, K=2. It should be noted that, irrespective of whether progressive or interlaced scan is used, the vertical scan period during which the imaging surface is two-dimensionally scanned to read out an image may be referred to as "one frame" in a broad sense.

Pixel Array Section

First Embodiment

Figure 6:
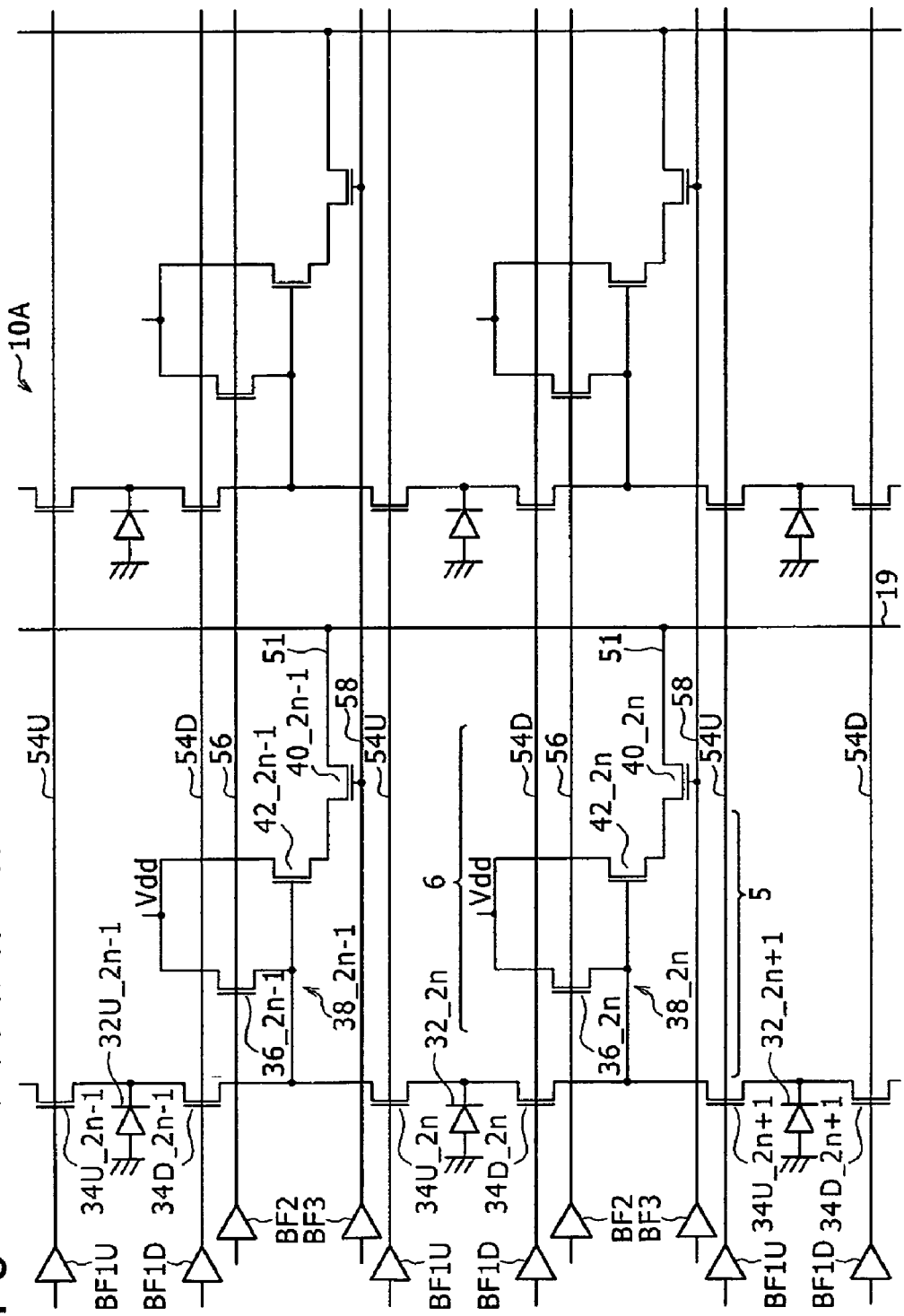
FIG. 6 is a diagram describing the pixel array section according to a first embodiment.

FIG. 5 is a diagram describing a pixel array section 10Z as a comparative example. FIG. 6 is a diagram describing a pixel array section 10A according to a first embodiment.

The charge generation sections 32, each including a photodiode and other components and adapted to generate signal charges are arranged two-dimensionally in a matrix form. As an example, the unit pixel 3 has a four-transistor configuration which includes four transistors (readout selection transistor 34, reset transistor 36, vertical selection transistor 40 and amplifying transistor 42), each having a different function, as its basic elements in addition to the charge generation section 32. The readout selection transistor 34, reset transistor 36, and amplifying transistor 42 make up, together with a floating diffusion 38, the pixel signal generation section 5. Then, the pixel signal generation section 5 and vertical selection transistor 40 make up a signal output section 6. The same section 6 generates and outputs the pixel signal voltage Vx for the signal charge generated by the charge generation section 32.

The transistors 34, 36, 40 and 42 may also be collectively referred to as the pixel transistors.

The gate of the readout selection transistor 34 (transfer transistor/readout transistor) making up the transfer section is connected, together with the gates of the same transistors 34 in the same rows, to a transfer wiring 54. The gates are driven by a transfer signal TRG from a transfer drive buffer BFT. The gate of the reset transistor 36 making up an initialization section is connected, together with the gates of the same transistors 36 in the same row, to a reset wiring 56. The gates are driven by a reset signal RST from a reset drive buffer BF2. The gate of the vertical selection transistor 40 (select transistor) is connected, together with the gates of the same transistors 40 in the same row, to a vertical selection line 58. The gates are driven by a vertical selection signal VSEL from a selection drive buffer BF3. The transfer wiring 54, reset wiring 56 and vertical selection line 58 are the row control lines 15 shown in FIG. 1.

All the transistors are n-channel MOS transistors. In general, a binary pulse which is active at high level (source voltage level) and inactive at low level (reference level) is used for all the signals, i.e., the transfer signal TRG, reset signal RST and vertical selection signal VSEL. The source voltage level is, for example, about 3 V. The reference level is, for example, 0.4 to 0.7 V or ground level, i.e., 0 V. However, some or all the pulses may be a negative potential of about −1 V depending on circumstances.

The charge generation sections 32, an example of detection section, which include a photodiode PD or other photoreceiving element DET, each have one end (anode side) of the photoreceiving element DET connected to a reference potential Vss on the low potential side (negative potential, for example, at about −1 V). The sections 32 each have the other end (cathode side) of the photoreceiving element DET connected to the input terminal (typically source) of the readout selection transistor 34. It should be noted that the reference potential Vss may be a ground potential GND. The readout selection transistor 34 has its output terminal (typically drain) connected to a connection node to which the reset transistor 36, floating diffusion 38 and amplifying transistor 42 are connected. The reset transistor 36 has its source connected to the floating diffusion 38 and its drain connected to a reset power source Vrd (normally serves also as a power source Vdd).

The vertical selection transistor 40 has, for example, its drain connected to the source of the amplifying transistor 42, its source connected to a pixel line 51 and its gate (specifically, referred to as a vertical selection gate SELV) connected to the vertical selection line 58. The pixel line 51 is connected, together with the other pixel lines 51 in the same column, to the vertical signal line 19. The amplifying transistor 42 has its gate connected to the floating diffusion 38, its drain connected to the power source Vdd and its source connected to the pixel line 51 and further to the vertical signal line 19 via the vertical selection transistor 40. It should be noted that the present embodiment is not limited to this configuration. Alternatively, the vertical selection transistor 40 and amplifying transistor 42 may be reversed in their positions so that the vertical selection transistor 40 has its drain connected to the power source Vdd and its source connected to the drain of the amplifying transistor 42 and so that the amplifying transistor 42 has its source connected to the pixel line 51.

One end of the vertical signal line 19 extends toward the column AD conversion section 26. The same line 19 is connected to the readout current control section 24 along its route. Although the detailed illustration thereof is omitted, the readout current control section 24 has a load MOS transistor along each vertical column and makes up, together with a reference current source section, a current mirror circuit having the gates of the load MOS transistors connected together. This current mirror circuit serves as a current source for the vertical signal lines 19. The section 24 also makes up, together with the amplifying transistor 42, a source follower which supplies an approximately constant operating current (readout current).

Here, the pixel array section 10 according to the first embodiment has a pixel sharing structure in which some of the components in the unit pixel 3 are shared by the plurality of unit pixels 3. The unit pixels 3 making up the unit pixel group 2 in the pixel array section 10 are configured in the same manner as in an ordinary CMOS image sensor. Here, a two-pixel sharing structure is shown as an example in which the two unit pixels 3 in the row direction (vertical direction) share the components to form the single unit pixel group 2. It should be noted that the configuration of the unit pixels 3 and that of the unit pixel group 2 formed by combining the unit pixels 3 are merely examples. The present embodiment is not limited thereto. For example, the present embodiment is not limited to the unit pixel group 2 made up of the two unit pixels 3. Instead, the same group 2 may be made up of the three, four or eight unit pixels 3.

From the viewpoint of circuit configuration, the unit pixel group 2 has the two charge generation sections 32. The same sections 32 share the reset transistor 36, floating diffusion 38 and amplifying transistor 42 except for the readout selection transistor 34. Unlike the pixel sharing structure shown in FIG. 5, however, the structure according to the first embodiment shown in FIG. 6 has the readout selection transistor 34 provided in such a manner that the charge generation sections 32 adapted to share the components can be changed from one field to another during interlaced scan.

That is, the comparative example shown in FIG. 5 has a pixel sharing structure adapted to add two pixels together in the vertical direction. In order to serve as means to transfer signal charges Qa and Qb, accumulated respectively in two charge generation sections 32a and 32b, to the common pixel signal generation section 5, the unit pixel group 2 has readout selection transistors 34a and 34b, transfer wirings 54a and 54b and transfer drive buffers BF1a and BF1b which are independent of each other. A first unit pixel 3a can be viewed as including the charge generation section 32a, readout selection transistor 34a and pixel signal generation section 5, and a second unit pixel 3b the charge generation section 32b, readout selection transistor 34b and pixel signal generation section 5. As a whole, the unit pixel group 2 includes five transistors. When viewed in terms of the charge generation sections 32a and 32b, these sections each have a four-transistor configuration in which the unit pixel 3 includes four transistors.

In the first embodiment shown in FIG. 6, on the other hand, the unit pixel group 2 has N (two in FIG. 6 or upper and lower) readout selection transistors 34U and 34D for each of the charge generation sections 32. The gate of each of the readout selection transistors 34U is driven by a transfer drive buffer BF1U connected to a transfer wiring 54U. The gate of each of the readout selection transistors 34D is driven by a transfer drive buffer BF1D connected to a transfer wiring 54D.

The readout selection transistors 34U and 34D for the same charge generation section 32 are connected to the pixel signal generation sections 5 in different rows. For example, a readout selection transistor $34D\_2n$ in a $2n$ row (n is a positive integer equal to or greater than 1) and a readout selection transistor $34U\_2n+1$ in a $2n+1$ row are connected to a pixel signal generation section $5\_2n$ (excluding the readout selection transistor 34) in the 2n row. A readout selection transistor 34D_2n–1 in a 2n–1 row and a readout selection transistor 34U_2n in the 2n row are connected to a pixel signal generation section 5_2n_1 (excluding the readout selection transistor 34) in the 2n–1 row.

The upper and lower charge generation sections 32 in each pare share the reset transistor 36, floating diffusion 38, vertical selection transistor 40 and amplifying transistor 42. In addition, the unit pixel group 2 can change, from one field to another, the charge generation sections 32 adapted to share the components by changing between the selected rows using the readout selection transistors 34U and 34D.

The rows of the readout selection transistors 34U and 34D to be activated can be selected according to the scan type, namely, progressive or interlaced scan. During interlaced scan, the readout selection transistors 34U and 34D connected to the pixel signal generation section 5 in the target row are turned ON. This allows for the floating diffusion 38 to add together the signal charges of the two charge generation sections 32.

The first embodiment is similar to the comparative example in that the first and second unit pixels 3 each include the two charge generation sections 32, two readout selection transistors 34 and pixel signal generation section 5 and that the two unit pixels 3 make up the unit pixel group 2. In the pixel sharing structure of the comparative example, however, the combination of the charge generation sections 32 adapted to share the components is fixed. In contrast, the pixel sharing structure of the first embodiment can, during interlaced scan, change the combination of the charge generation sections 32 adapted to share the components between odd and even fields using the readout selection transistors 34U and 34D as described later, which is a significant difference from the comparative example.

Interlaced Scan

First Embodiment

Figure 8:
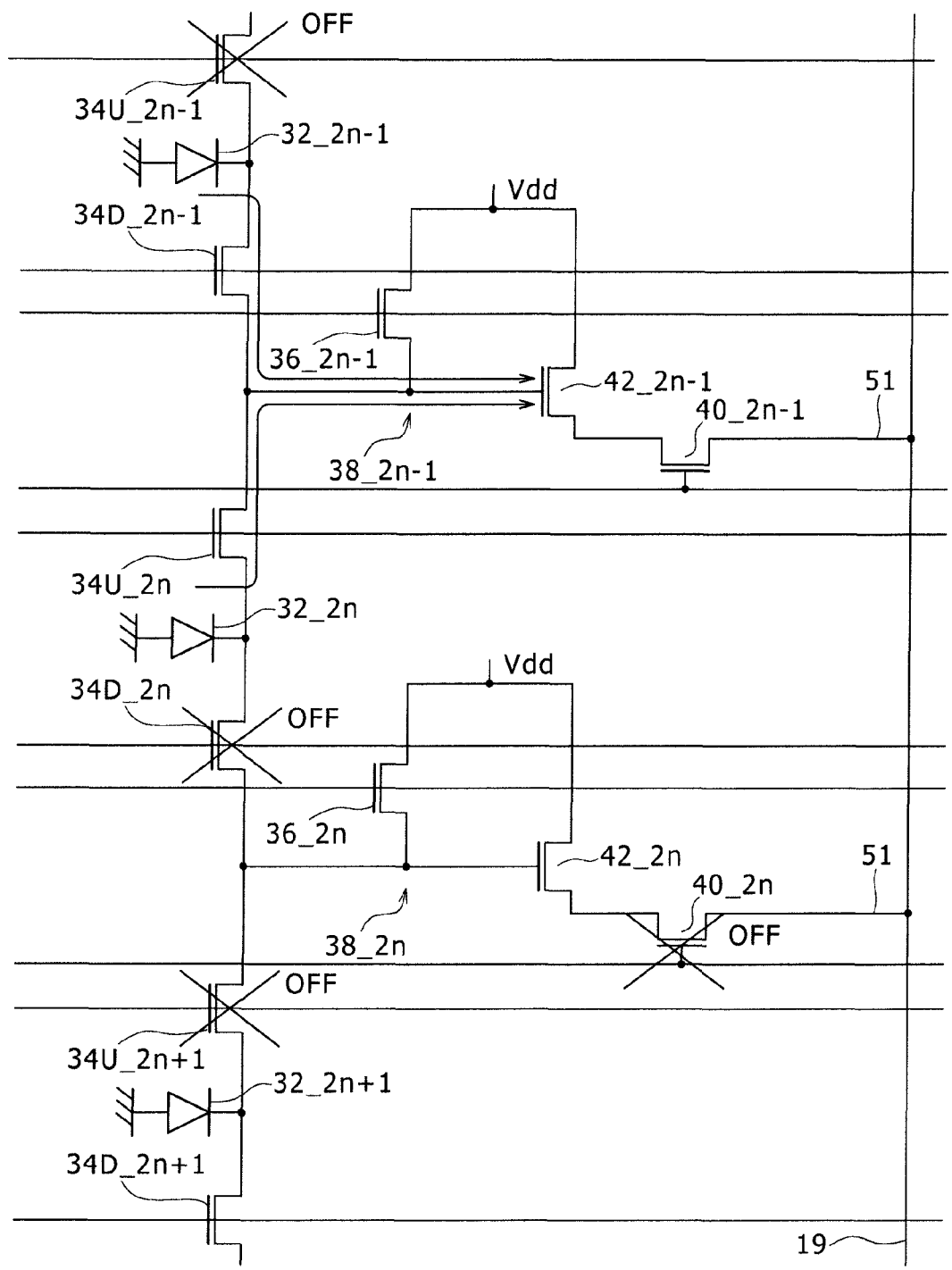
FIG. 8 is a diagram describing a signal flow during odd field readout in interlaced scan in the first embodiment.
Figure 9:
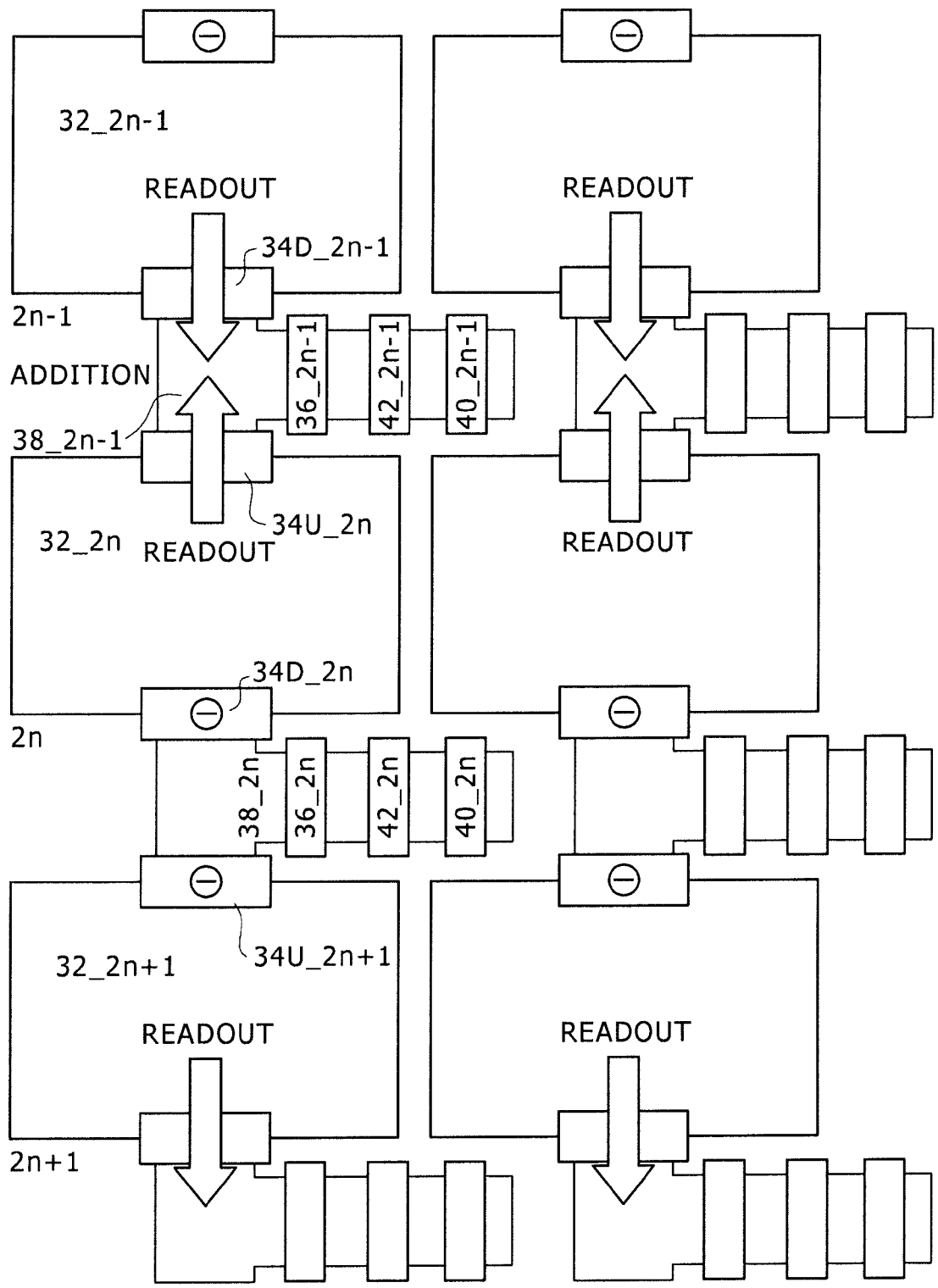
FIG. 9 is a conceptual diagram of odd field readout in interlaced scan in the first embodiment.
Figure 10:
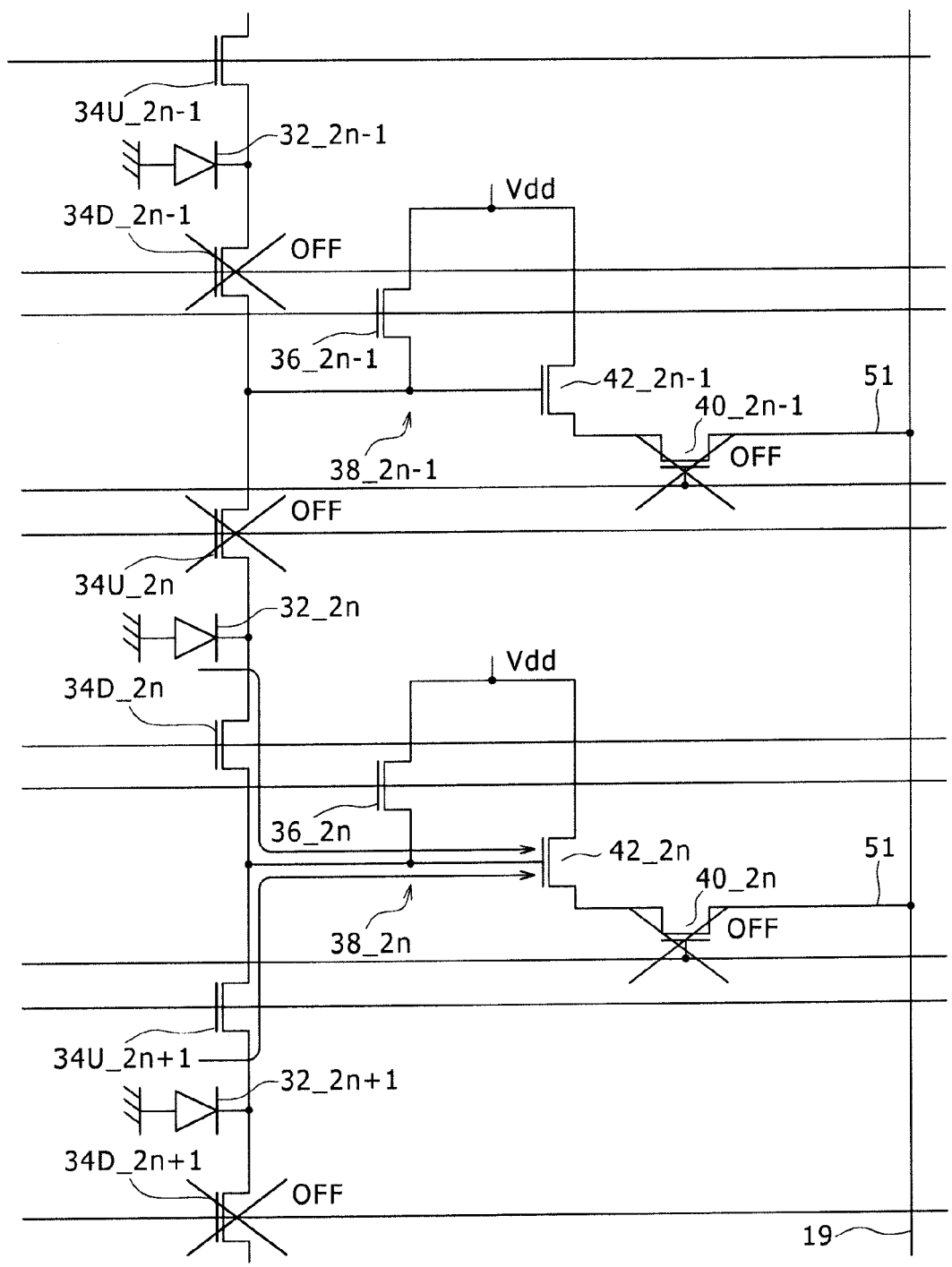
FIG. 10 is a diagram describing a signal flow during even field readout in interlaced scan in the first embodiment.
Figure 11:
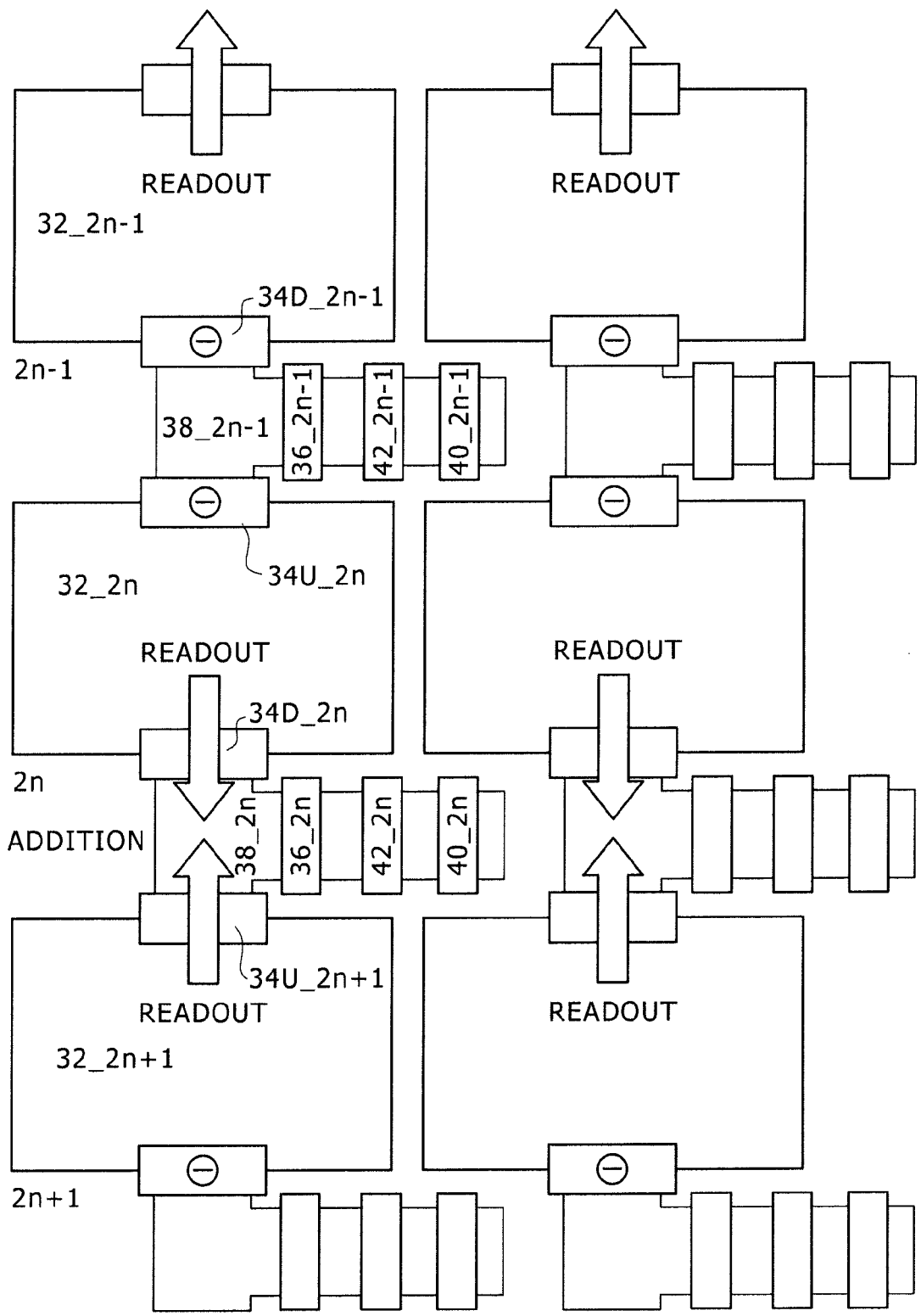
FIG. 11 is a conceptual diagram of even field readout in interlaced scan in the first embodiment.

FIGS. 7 to 12B-2 are diagrams describing interlaced scan according to the first embodiment. Here, FIG. 7 is a diagram describing the combinations of the charge generation sections 32 and pixel transistors for interlaced scan (how the unit pixel group 2 is formed). FIG. 8 is a diagram describing a signal flow during odd field readout in interlaced scan in the first embodiment. FIG. 9 is a conceptual diagram of odd field readout in interlaced scan in the first embodiment. FIG. 10 is a diagram describing a signal flow during even field readout in interlaced scan in the first embodiment. FIG. 11 is a conceptual diagram of even field readout in interlaced scan in the first embodiment. FIGS. 12A-1 to 12B-2 are diagrams describing the effect of alleviating time shading distortion associated with line exposure thanks to interlaced scan.

Interlaced scan of the first embodiment divides a screen into two images (even and odd fields) and reads these images separately in two steps by reading every two vertical scan lines (rows of the pixel signal generation sections 5 and signal output sections 6 in the present embodiment) of a screen.

First, a case will be described in which an odd field is formed by the pixel signals from the signal output sections 6 in the odd rows (2n–1: n is a positive integer equal to or greater than 1). As illustrated in FIG. 7, the readout selection transistors 34D_2n–1 and 34U_2n respectively in the 2n–1 and 2n rows are used in combination so that charge generation sections 32_2n–1 and 32_2n respectively in the 2n–1 and 2n rows share a pixel signal generation section 5_2n–1 in the 2n–1 row.

In this case, when a vertical selection transistor 40_2n–1 is activated, both of the readout selection transistors 34D_2n–1 and 34U_2n are activated, as illustrated in FIG. 8. This allows for a floating diffusion 38_2n–1 to add together the signal charges generated by the charge generation sections 32_2n–1 and 32_2n. The resultant charge is converted into the pixel signal voltage Vx by the pixel signal generation section 5_2n–1 first, and then transferred to the column AD conversion section 26 via the vertical signal line 19.

As illustrated in FIG. 9, when attention is focused on the pixel in the center, a signal charge is read out from the lower charge generation section 32_2n into the floating diffusion 38_2n–1, which is shared with the upper charge generation section 32_2n–1 by turning ON the readout selection transistor 34U_2n. A signal charge is also read out from the upper charge generation section 32_2n–1 into the floating diffusion 38_2n–1 where the two signal charges are added together.

Next, a case will be described in which an even field is formed by the pixel signals from the signal output sections 6 in the even rows (2n–1: n is a positive integer equal to or greater than 1). As illustrated in FIG. 7, the readout selection transistors 34D_2n and 34U_2n+1 respectively in the 2n and 2n+1 rows are used in combination so that charge generation sections 32_2n and 32_2n+1 respectively in the 2n and 2n+1 rows share the pixel signal generation section 5_2n in the 2n row.

In this case, when a vertical selection transistor 40_2n is activated, both of the readout selection transistors 34D_2n and 34U_2n+1 are activated, as illustrated in FIG. 10. This allows for a floating diffusion 38_2n to add together the signal charges generated by the charge generation sections 32_2n and 32_2n+1. The resultant charge is converted into the pixel signal voltage Vx by the pixel signal generation section 5_2n first, and then transferred to the column AD conversion section 26 via the vertical signal line 19.

As illustrated in FIG. 11, when attention is focused on the pixel in the center, a signal charge is read out from the upper charge generation section 32_2n into the floating diffusion 38_2n, which is shared with the lower charge generation section 32_2n+1 by turning ON the readout selection transistor 34D_2n. A signal charge is also read out from the lower charge generation section 32_2n+1 into the floating diffusion 38_2n where the two signal charges are added together.

As described above, the combinations of the readout selection transistors 34 (readout gates) are changed from one field to another during interlaced scan. This permits selection of the pixel signal generation section 5 (e.g., floating diffusion 38) into which the signal charges are read out.

The two readout selection transistors 34D and 34U are provided for each of the charge generation sections 32. A selective combination of the same transistors 34D and 34U makes it possible for the plurality of charge generation sections 32 to share the single pixel signal generation section 5 (e.g., floating diffusion 38 excluding the readout selection transistors 34). By selecting the rows of the readout selection transistors 34D and 34U to be activated to match interlaced scan, the signals in the form of charges can be added together by the floating diffusion 38. This eliminates the need for any signal addition memory in the pixel section, thus preventing increased chip area. Although the floating diffusion 38 is shared by the plurality of charge generation sections 32 and readout selection transistors 34, there is almost no increase in parasitic capacitance of the floating diffusion 38, thus preventing significant reduction in conversion efficiency.

The present embodiment is expected to provide N-fold improvement in S/N ratio as compared to the related art which adds the signals in the memory section. N is the number of the charge generation sections 32 to be added together. At this time, the number of the readout selection transistors 34 for the charge generation sections 32 is also N.

First embodiment: S=2 folds, N=1 fold→S/N=2
    Related art: S=1 fold, N=1 fold→S/N=1
(assuming that S and N in the prior art are one-fold.)

Further, there is no need for any separate charge storage sections in the pixel array section 10 to temporarily store charges in addition to the floating diffusions 38. As a result, it is not necessary to reduce the size of the charge generation sections 32, thus preventing the reduction in saturation signal level. Although the plurality of readout selection transistors 34D and 34U must be provided, the present embodiment causes only a smaller reduction in size of the charge generation sections 32 as compared to the case in which separate charge accumulation sections (for temporarily storing charges) are provided in addition to the existing charge accumulation sections (floating diffusions 38) provided in the pixel signal generation sections 5 (signal output sections 6).

Moreover, the present embodiment adds together the signal charges using the floating diffusions 38. An increase in signal level translates "as-is" into an increase in the pixel signal voltage Vx. This provides improved S/N ratio commensurate with the increased signal level.

Because the N (two in the previous example) readout selection transistors 34 are provided for each of the charge generation sections 32, the inactive level of the gate of the other readout selection transistor 34 not used for signal charge transfer can be decreased to a lower-than-normal level during readout and/or electronic shutter. In this example, if the normal inactive level is the ground level, the inactive level can be decreased to a negative level. If the normal inactive level is a negative level, the inactive level can be decreased to a lower negative level. This is shown by circles with a negative sign "−" inside in FIGS. 9 and 11. As a result, this provides an effective potential gradient in the transfer direction. A potential gradient effective for charge transfer provided to the charge generation sections 32 contributes to improved transfer efficiency of the readout selection transistor 34 adapted to transfer signal charges.

As illustrated in FIGS. 12A-1 and 12B-1, on the other hand, the signal charges of each pair of the charge generation sections 32, one in an odd row and the other in the next even row, are added together, and the target signal is read out from the signal output section 6 in the odd row (black dot in the figures) for an odd field during interlaced scan. For an even field, the signal charges of each pair of the charge generation sections 32, one in an even row and the other in the next odd row, are added together, and the target signal is read out from the signal output section 6 in the even row (black dot in the figures). Each field image resulting from interlaced scan is composed of alternate vertical scan lines. However, the field period is half the existing frame period. Therefore, this provides fifty percent reduction from the existing one in time shading distortion (motion distortion) in both fields, thus alleviating time shading distortion associated with line exposure. As illustrated in FIGS. 12A-2 and 12B-2, it is clear that the motion distortion of the fast-moving subject has been reduced in both fields as compared to that in FIG. 4C.

However, two field images are captured with a time difference equal to the field period. Therefore, a blur occurs in the still image formed by combining the two field images if the subject is moving. That is, an image formed by combining interlaced odd and even fields suffers a misalignment between even and odd fields for a moving subject. In the case of a moving image, this misalignment is hardly problematic. In the case of a still image, it may be problematic. For still image capture, therefore, it is only necessary to select one of the two schemes, interlaced and progressive scan, depending on which of the interlaced and progressive images is preferred by weighing motion distortion associated with line exposure in progressive scan against misalignment between even and odd fields in interlaced scan. Naturally, progressive scan in combination with mechanical shutter may be used for still image capture.

Progressive Scan

First Embodiment

Figure 14:
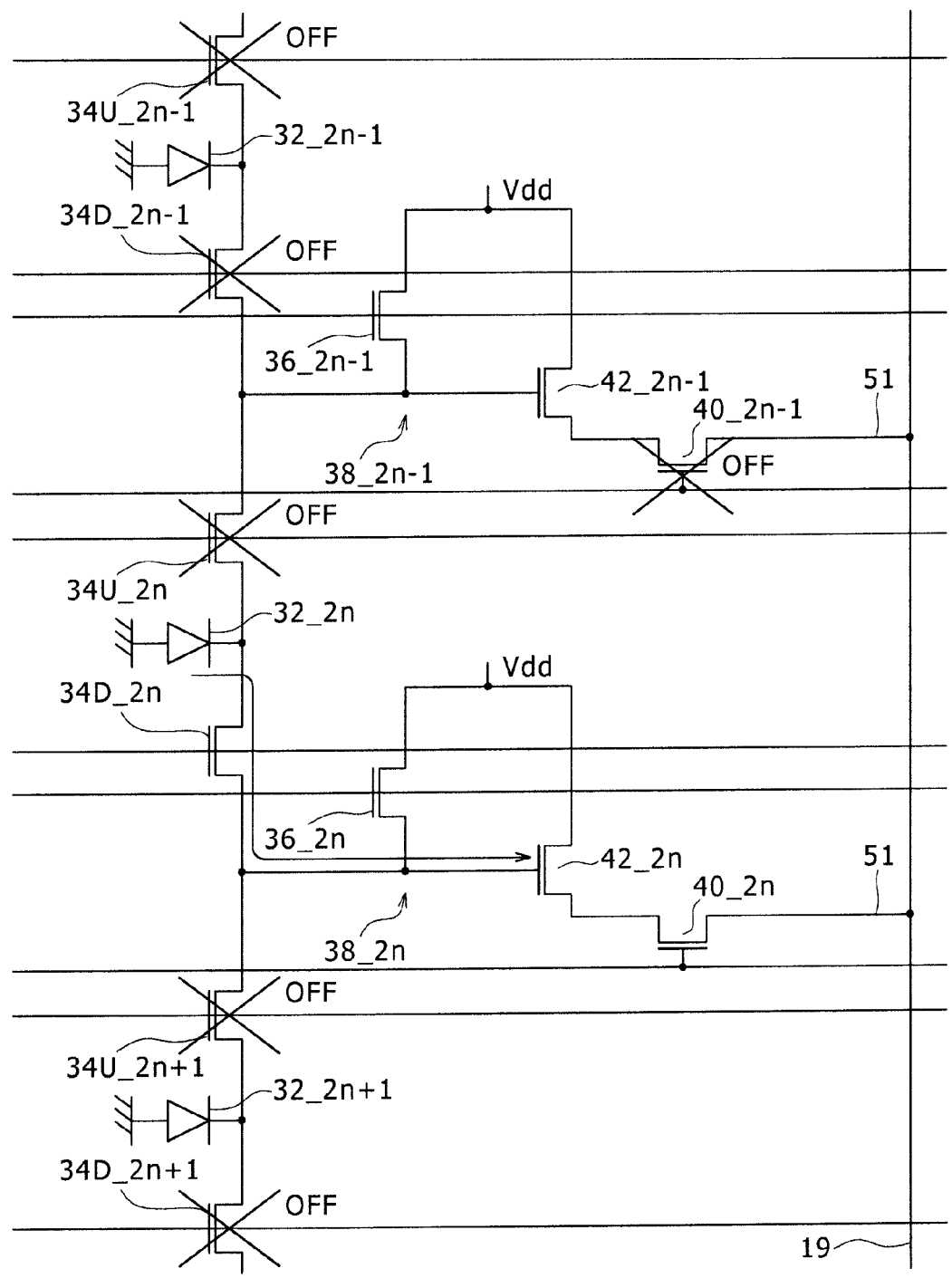
FIG. 14 is a diagram describing a first example of signal flow during readout in progressive scan in the first embodiment.
Figure 15:
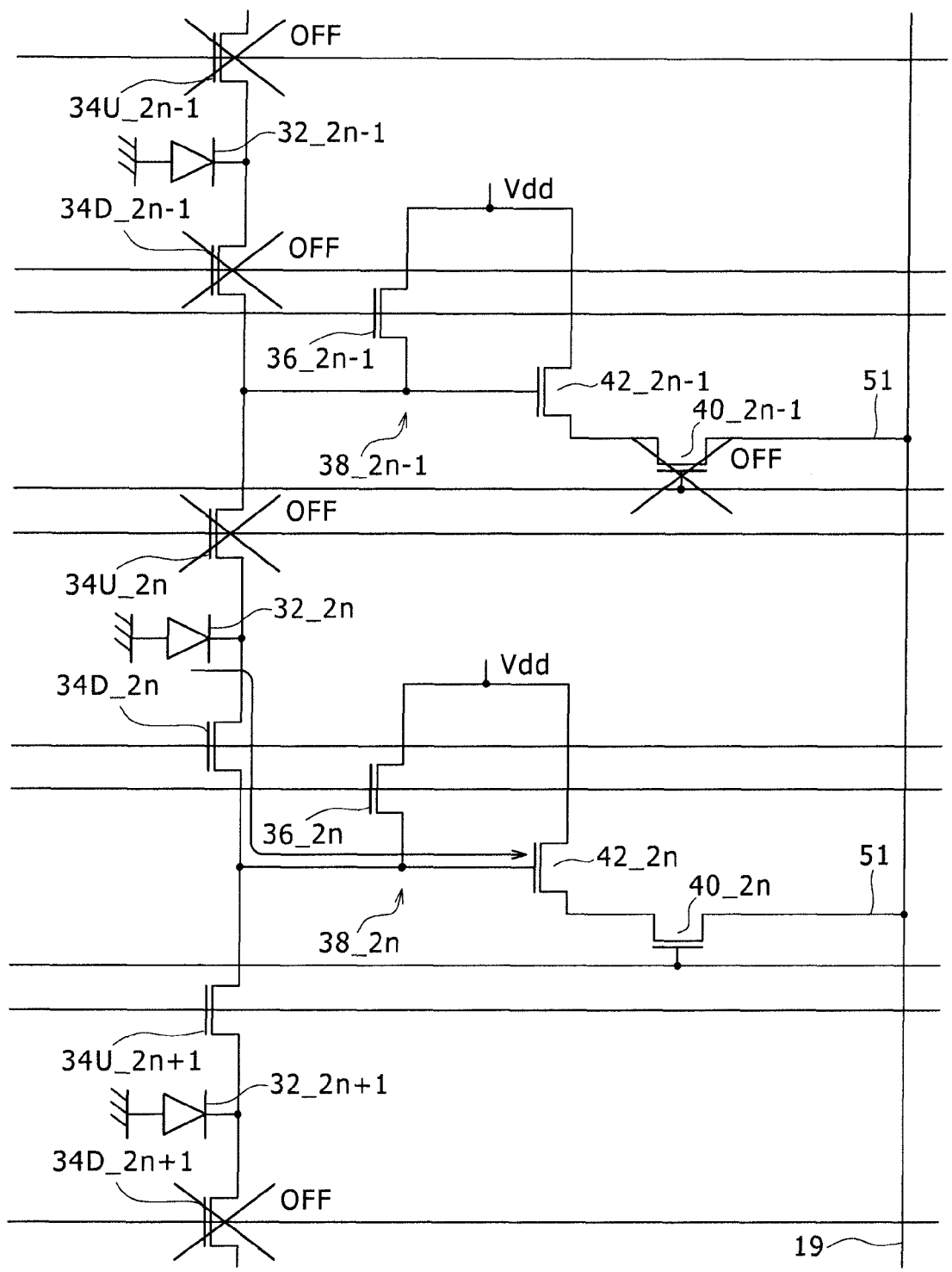
FIG. 15 is a diagram describing a second example of signal flow during readout in progressive scan in the first embodiment.

FIG. 13 is a diagram describing the combinations of the charge generation section 32 and pixel transistors for progressive scan in the first embodiment. FIG. 14 is a diagram describing a first example of signal flow during readout in progressive scan in the first embodiment. FIG. 15 is a diagram describing a second example of signal flow during readout in progressive scan in the first embodiment.

Because there are a plurality of (two in the previous example) readout selection transistors 34 for each of the charge generation sections 32, a plurality of readout methods can be used depending on which of the readout selection transistors 34 is used. For the single charge generation section 32, it is only necessary to use either of the readout selection transistors 34U and 34D. For example, there are basically two possible methods, i.e., first and second examples, as illustrated in FIG. 13. In the first example, a charge generation section 32_$k$, readout selection transistor 34D_$k$ and pixel signal generation section 5_$k$, all in a k row (k is a positive integer), are used in combination. In the second example, a charge generation section 32_$k+1$ and readout selection transistor 34U_$k+1$ in a k+1 row (k is a positive integer) and the pixel signal generation section 5_$k$ in the k row, are used in combination. Naturally, modifications including switching between the first and second examples from one readout row to another are also possible.

In the case of the first example, when a vertical selection transistor 40_$k$ is activated, the readout selection transistor 34D_$k$ is activated, as illustrated in FIG. 14. This allows for the signal charge generated by the charge generation section 32_$k$ to be read out into a floating diffusion 38_$k$. The charge is converted into the pixel signal voltage Vx by the pixel signal generation section 5_$k$ first, and then transferred to the column AD conversion section 26 via the vertical signal line 19.

In the case of the second example, when the vertical selection transistor 40_$k$ is activated, the readout selection transistor 34U_$k+1$ is activated, as illustrated in FIG. 15. This allows for the signal charge generated by the charge generation section 32_$k+1$ to be read out into the floating diffusion 38_$k$. The charge is converted into the pixel signal voltage Vx by the pixel signal generation section 5_$k$ first, and then transferred to the column AD conversion section 26 via the vertical signal line 19.

As described above, the pixel circuit structure according to the first embodiment supports not only interlaced scan but also ordinary progressive scan.

Pixel Array Section

Second Embodiment

FIG. 16 is a diagram describing a pixel array section 10B according to a second embodiment. The second embodiment offers the unit pixel 3 having a three-transistor configuration modified from a four-transistor one. The three-transistor configuration is devoid of the vertical selection transistor 40 as compared to the four-transistor configuration. The second embodiment is similar in all other respects to the first embodiment. The second embodiment has the N (two or 34U and 34D in the previous example) readout selection transistors 34 for each of the charge generation sections 32, allowing for selection of the rows of the readout selection transistors 34U and 34D to be activated to match interlaced scan.

As in the first embodiment, the floating diffusion 38 is connected to the gate of the amplifying transistor 42 in the second embodiment. Thus the amplifying transistor 42 outputs the signal commensurate with the potential of the floating diffusion 38 to the vertical signal line 19.

The reset transistor 36 has its reset wiring 56 extending in the row direction. A drain line 59 is common to almost all the pixels. The drain line 59 is driven by a source voltage from a drain drive buffer BF4. Driven by the reset drive buffer BF2, the reset transistor 36 controls the potential of the floating diffusion 38. Here, although separated in the row direction, the drain line 59 is substantially common to all the rows.

As described above, unlike the four-transistor counterpart, the three-transistor configuration is devoid of the vertical selection transistor 40 which would otherwise be connected in series to the amplifying transistor 42. As a result, the pixel signal generation section 5 serves "as-is" as the signal output section 6. The vertical signal line 19 has a number of pixels connected thereto. However, the selection of pixels is made by controlling the FD potential rather than the vertical selection transistor 40. The FD potential is normally low. During pixel selection, however, the FD potential of the selected pixel is pulled high, thus allowing the signal of the selected pixel to be read out into the vertical signal line 19. Then, the FD potential of the selected pixel is pulled back low. This operation is performed simultaneously on the pixels in one row.

As described above, the FD potential control operation is as follows: 1) pull the drain line 59 high to pull the FD potential of the selected row high via the reset transistor 36 in the selected row, and 2) pull the drain line 59 low to pull the FD potential of the selected row low via the reset transistor 36 in the selected row.

On the other hand, the signal charge of the charge generation section 32 is read out into the floating diffusion 38 by the readout selection transistor 34. As a result, the four- and three-transistor configurations are similar in this respect. Therefore, the description of switching between the readout selection transistors 34 during interlaced and progressive scan in relation to the first embodiment is applicable "as-is" to the second embodiment.

Pixel Array Section

Third Embodiment

FIG. 17 is a diagram describing a pixel array section 10C according to a third embodiment. In the third embodiment, components are shared between a plurality of columns in the horizontal direction. In the normal pixel structure, the pixels in the vertical direction are not added together. This has been changed in the third embodiment so that two pixels in the vertical direction are added together during interlaced scan. Because there are a plurality of such columns, the third embodiment supports a two-row-by-M-column addition mode. For simplification, a description will be made of a case in which M=2.

As in the first embodiment, the unit pixel group 2 has the two readout selection transistors 34U and 34D for each of the charge generation sections 32 in the third embodiment. Unlike in the first embodiment, the pixel signal generation section 5 (excluding the readout selection transistors 34) is shared between two rows. Although not illustrated, the gates of the readout selection transistors 34U, one in an odd column and another in an even column, are connected to the different transfer wirings 54D and driven by the transfer drive buffers BF1U independent of each other. The gates of the readout selection transistors 34D, one in an odd column and another in an even column, are connected to the different transfer wirings 54D and driven by the transfer drive buffers BF1D independent of each other.

The readout selection transistors 34U and 34D for the same charge generation section 32 are connected to the pixel signal generation sections 5 in different rows. However, the readout selection transistors 34U or 34D of the charge generation sections 32 in the paired columns, i.e., one in an odd column and the other in an even column, are connected to the pixel signal generation section 5 in the same row.

As a result, the one floating diffusion 38 is shared among the four charge generation sections 32, namely, the upper left, lower left, upper right and lower right ones. That is, the four charge generation sections 32 share the one reset transistor 36, one floating diffusion 38, one vertical selection transistor 40 and one amplifying transistor 42.

As in the first embodiment, the rows of the readout selection transistors 34D and 34U to be activated can be selected to match progressive and interlaced scan. During interlaced scan, the upper and lower readout selection transistors 34D and 34U in two columns, i.e., $2m-1$th and $2m$th columns (m is a positive integer equal to or greater than 1), are turned ON. This allows for the floating diffusion 38 to add together the signal charges of the four charge generation sections 32. The third embodiment is similar to the first embodiment in that, during interlaced scan, the combination of the upper and lower charge generation sections 32 adapted to share the components can be changed between odd and even fields by changing between the readout selection transistors 34U and 34D.

Interlaced Scan

Third Embodiment

Figure 19:
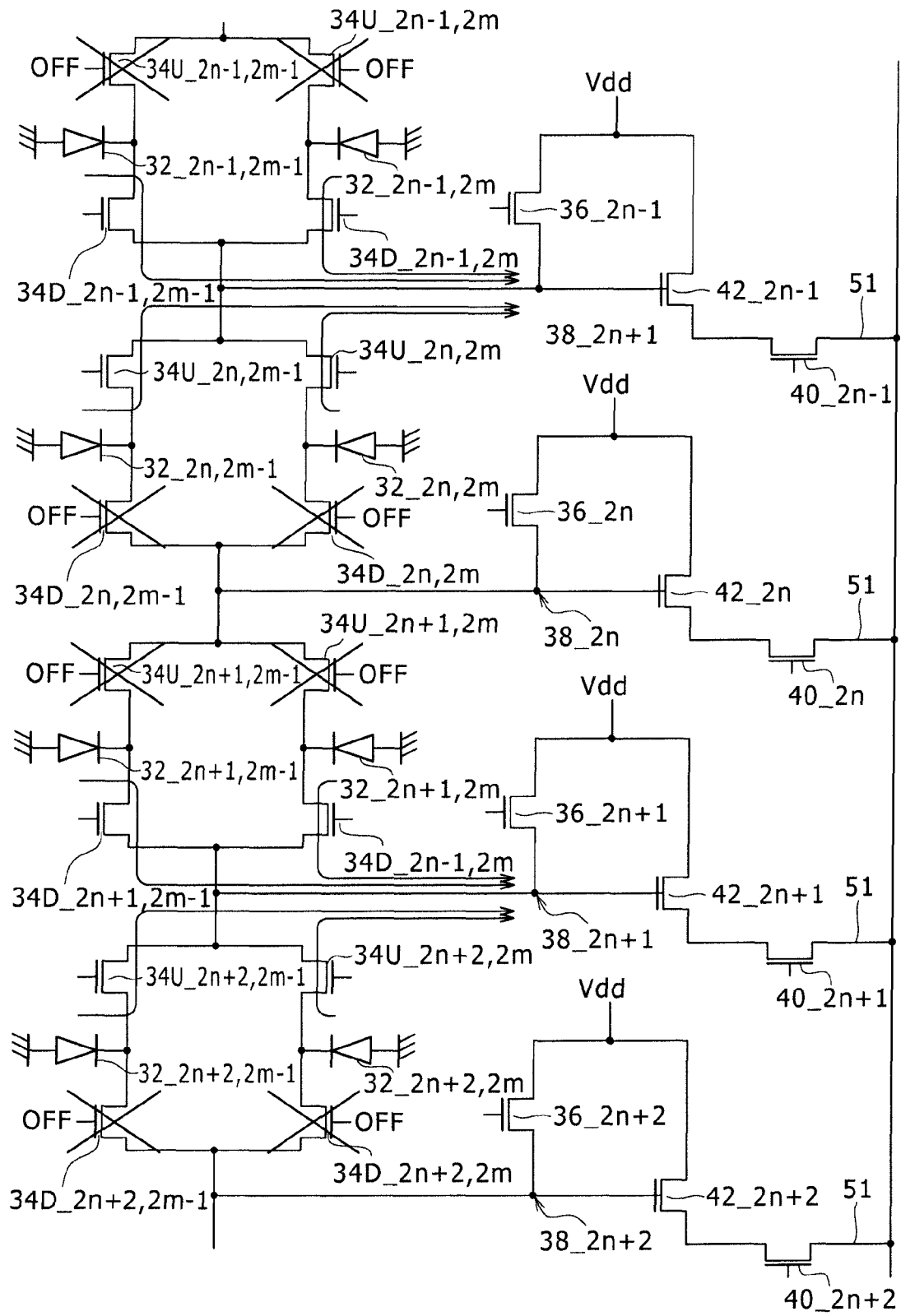
FIG. 19 is a diagram describing a signal flow during odd field readout in interlaced scan in the third embodiment.
Figure 20:
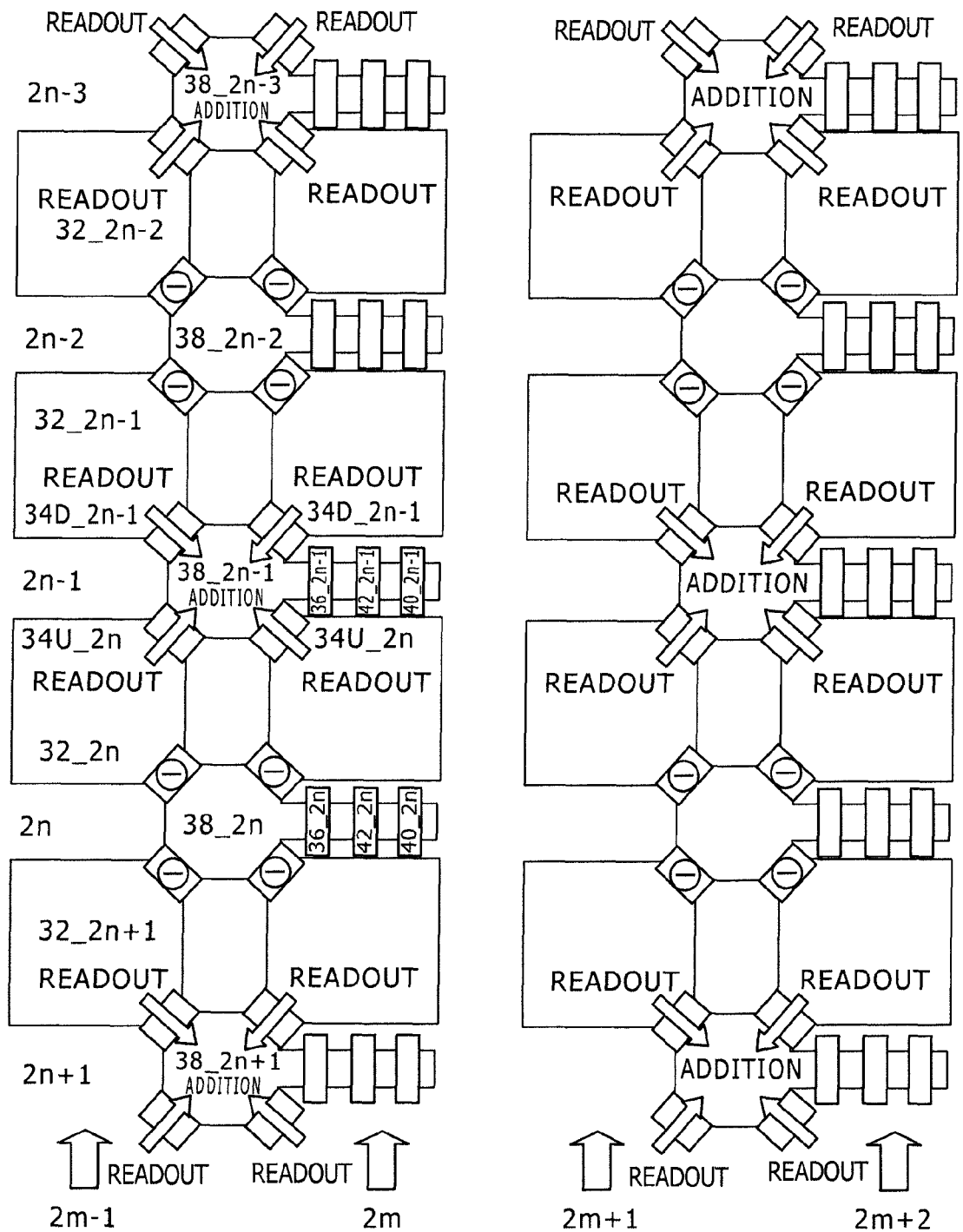
FIG. 20 is a conceptual diagram of odd field readout in interlaced scan in the third embodiment.
Figure 21:
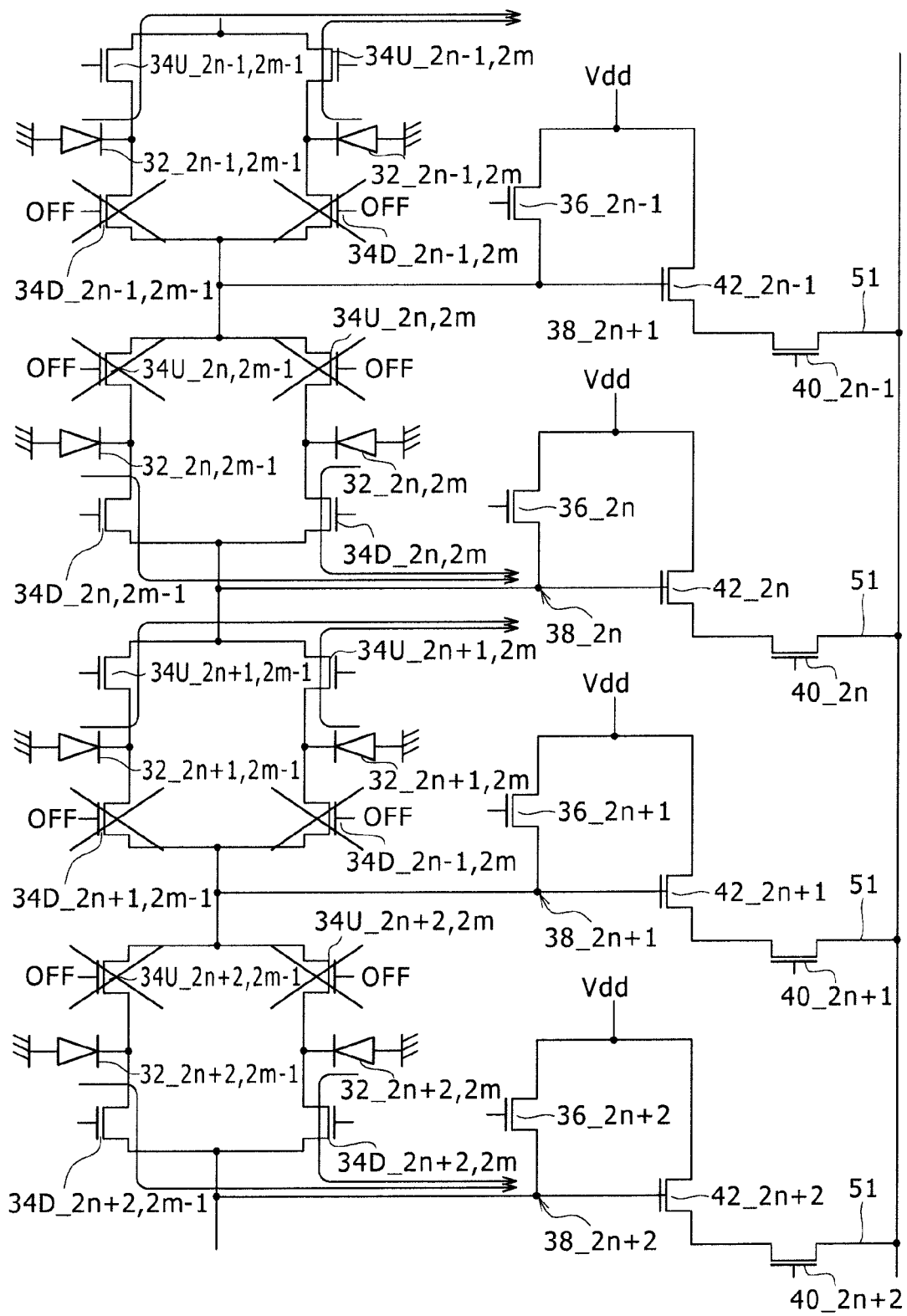
FIG. 21 is a diagram describing a signal flow during even field readout in interlaced scan in the third embodiment.
Figure 22:
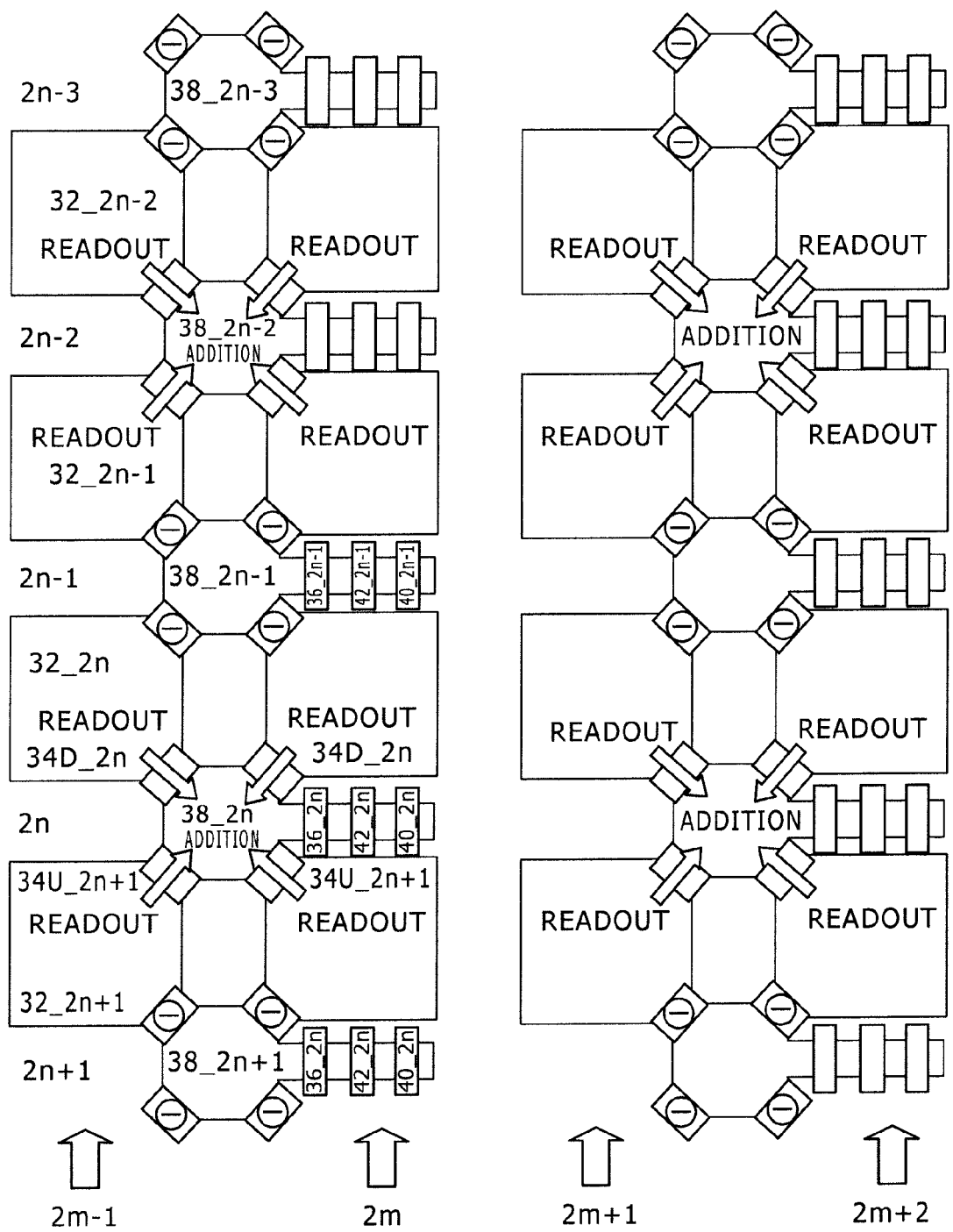
FIG. 22 is a conceptual diagram of even field readout in interlaced scan in the third embodiment.

FIGS. 18A to 22 are diagrams describing interlaced and progressive scan in the third embodiment. Here, FIGS. 18A and 18B are diagrams describing the combinations of the charge generation sections 32 and pixel transistors for interlaced and progressive scan in the third embodiment. FIG. 19 is a diagram describing a signal flow during odd field readout in interlaced scan. FIG. 20 is a conceptual diagram of odd field readout in interlaced scan. FIG. 21 is a diagram describing a signal flow during even field readout in interlaced scan. FIG. 22 is a conceptual diagram of even field readout in interlaced scan.

First, a case will be described in which an odd field is formed by the pixel signals from the signal output sections 6 in the odd rows ($2n-1$: n is a positive integer equal to or greater than 1). As illustrated in FIG. 18A, a pixel signal generation section 5_$2n-1,2m$ in an odd row is shared among four charge generation sections 32, namely, a charge generation section 32_$2n-1,2m-1$ in the $2n-1$ row of a $2m-1$th column (m is a positive integer equal to or greater than 1), a charge generation section 32_$2n,2m-1$ in the $2n$ row of the $2m-1$th column, a charge generation section 32_$2n-1,2m$ in the $2n-1$ row of a $2m$th column, and a charge generation section 32_$2n,2m$ in the $2n$ row of the $2m$th column. Therefore, four readout selection transistors 34, namely, a readout selection transistor 34D_2n−1,2m−1 in the 2n−1 row of the 2m−1th column, a readout selection transistor 34U_2n,2m−1 in the 2n row of the 2m−1th column, a readout selection transistor 34D_2n−1,2m in the 2n−1 row of the 2mth column and a readout selection transistor 34U_2n,2m in the 2n row of the 2mth column, are used in combination.

In this case, when a vertical selection transistor 40_2n−1,2m is activated, the readout selection transistors 34D_2n−1,2m−1, 34U_2n,2m−1, 34D_2n−1,2m and 34U_2n,2m are all activated, as illustrated in FIG. 19. This allows for a floating diffusion 38_2n−1,2m to add together the signal charges generated by the charge generation sections 32_2n−1,2m−1, 32_2n,2m−1, 32_2n−1,2m and 32_2n,2m. The resultant charge is converted into the pixel signal voltage Vx by the pixel signal generation section 5_2n−1,2m first, and then transferred to the column AD conversion section 26 via the vertical signal line 19.

Attention is focused on the charge generation section 32_2n,2m−1 which is the second one from the bottom in the 2m−1th column, as illustrated in FIG. 20. By turning ON the readout selection transistor 34U_2n,2m−1, the signal charge is read out from this charge generation section into the floating diffusion 38_2n−1,2m which is shared among the charge generation section 32_2n,2m−1 and three other charge generation sections 32, namely, the upper, right and upper right charge generation sections 32_2n−1,2m−1, 32_2n,2m and 32_2n−1,2m. The signal charges are also read out from the upper, right and upper right charge generation sections 32_2n−1,2m−1, 32_2n,2m and 32_2n−1,2m into the floating diffusion 38_2n−1,2m where the signal charges are added together.

Next, a case will be described in which an even field is formed by the pixel signals from the signal output sections 6 in the even rows (2n: n is a positive integer equal to or greater than 1). As illustrated in FIG. 18A, a pixel signal generation section 5_2n,2m in an even row is shared among four charge generation sections 32, namely, the charge generation section 32_2n,2m−1 in the 2n row of the 2m−1th column, a charge generation section 32_2n+1,2m−1 in a 2n+1 row of the 2m−1th column, the charge generation section 32_2n,2m in the 2n row of the 2mth column, and a charge generation section 32_2n+1,2m in the 2n+1 row of the 2mth column. Therefore, four readout selection transistors 34, namely, a readout selection transistor 34D_2n,2m−1 in the 2n row of the 2m−1th column, a readout selection transistor 34U_2n+1,2m−1 in the 2n+1 row of the 2m−1th column, a readout selection transistor 34D_2n,2m in the 2n row of the 2mth column and a readout selection transistor 34U_2n+1,2m in the 2n+1 row of the 2mth column, are used in combination.

In this case, when a vertical selection transistor 40_2n,2m is activated, the readout selection transistors 34D_2n,2m−1, 34U_2n+1,2m−1, 34D_2n,2m and 34U_2n+1,2m are all activated, as illustrated in FIG. 21. This allows for a floating diffusion 38_2n,2m to add together the signal charges generated by the charge generation sections 32_2n,2m−1, 32_2n+1,2m−1, 32_2n,2m and 32_2n+1,2m. The resultant charge is converted into the pixel signal voltage Vx by the pixel signal generation section 5_2n,2m first, and then transferred to the column AD conversion section 26 via the vertical signal line 19.

Attention is focused on the charge generation section 32_2n,2m−1 which is the second one from the bottom in the 2m−1th column, as illustrated in FIG. 22. By turning ON the readout selection transistor 34D_2n,2m−1, the signal charge is read out from this charge generation section 32_2n,2m−1 into the floating diffusion 38_2n,2m which is shared among the charge generation section 32_2n,2m−1 and three other charge generation sections 32, namely, the lower, right and lower right charge generation sections 32_2n+1,2m−1, 32_2n,2m and 32_2n+1,2m. The signal charges are also read out from the lower, right and lower right charge generation sections 32_2n+1,2m−1, 32_2n,2m and 32_2n+1,2m into the floating diffusion 38_2n,2m where the signal charges are added together.

As described above, the readout selection transistors 34 (readout gates) are changed from one field to another during interlaced scan to select the pixel signal generation section 5 (e.g., floating diffusion 38) into which the signal charges are to be read even in the second embodiment which supports two-by-two-pixel addition.

The third embodiment differs from the first one in that a plurality of pixels (two pixels in the previous example) in the horizontal direction are also added together. However, the third embodiment is similar to the first one in the manner in which pixels are added in the vertical direction. Therefore, the third embodiment provides the same advantageous effects as the first one. The third embodiment is also similar to the first one in that the inactive level of the gate of the other readout selection transistor 34 not used for signal charge transfer can be decreased to a lower-than-normal level during readout and/or electronic shutter. This is shown by circles with a negative sign "−" inside in FIGS. 20 and 22.

Although not illustrated, the signal flow during progressive scan in the pixel structure according to the third embodiment is similar to that in the first embodiment. As illustrated in FIG. 18B, two examples are possible, the first one in which charge generation sections 32_k,2m−1 and 32_k,2m in the k row (k is a positive integer) and a pixel signal generation section 5_k,2m in the k row are used in combination, and the second one in which charge generation sections 32_k+1,2m−1 and 32_k+1,2m in the k+1 row (k is a positive integer) and the pixel signal generation section 5_k,2m in the k row are used in combination. Naturally, modifications including switching between the first and second examples from one readout row to another are also possible.

Pixel Array Section

Fourth Embodiment

Figure 23:
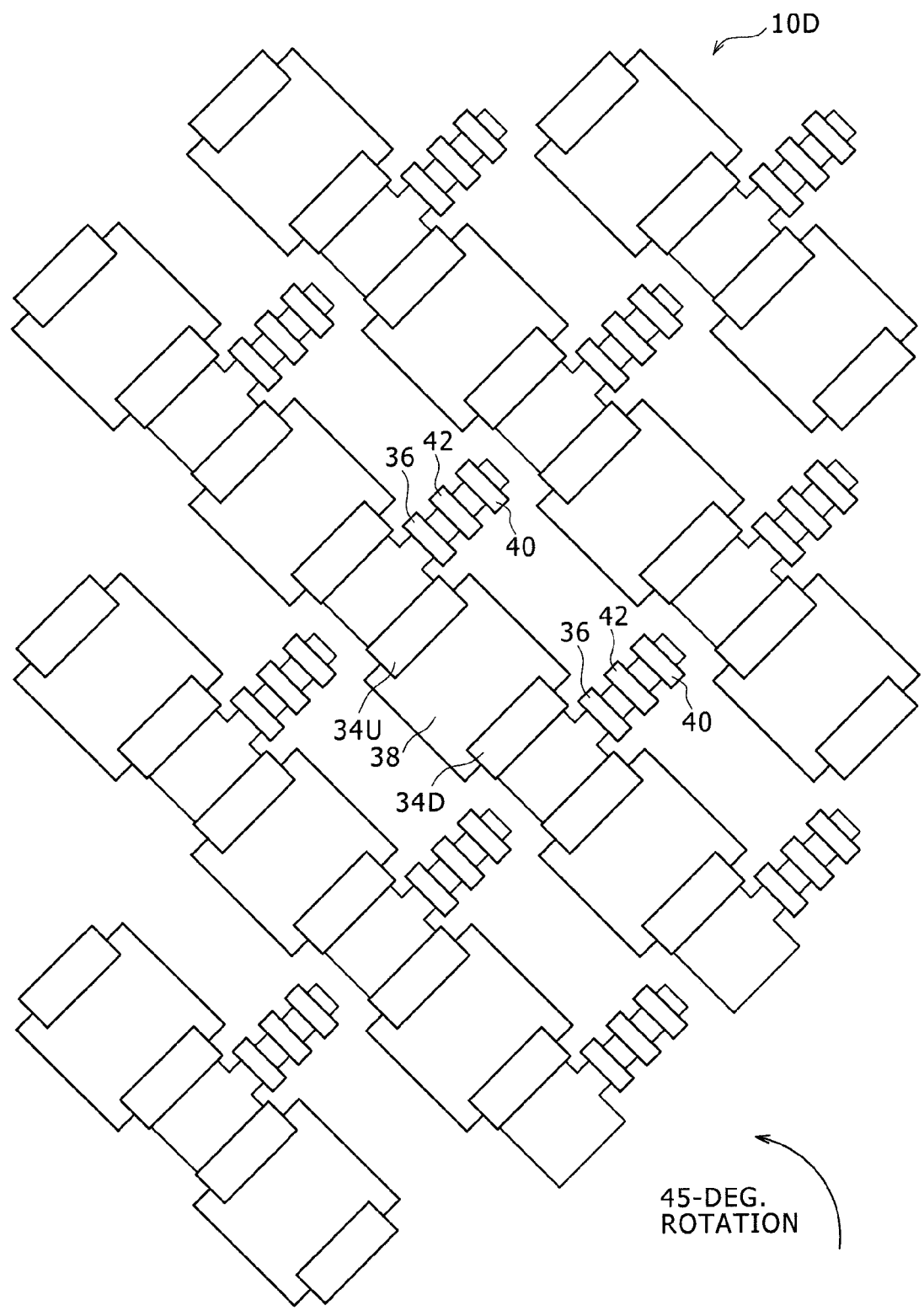
FIG. 23 is a diagram describing the pixel array section according to a fourth embodiment.

FIG. 23 is a diagram describing a pixel array section 10D according to a fourth embodiment. The fourth embodiment has a pixel arrangement structure rotated 45 degrees from that of the first embodiment. This structure need only be considered by diagonally rotating the page 45 degrees. The same schemes applicable to the first embodiment are also applicable to the fourth embodiment for interlaced and progressive scan. As a result, the fourth embodiment provides the same advantageous effects as the first one.

Although not illustrated, the fourth embodiment is also applicable, for example, to a honeycomb arrangement. Therefore, it is imaginable that the fourth embodiment can provide the same advantageous effects.

Pixel Array Section

Fifth Embodiment

FIG. 24 is a diagram describing a pixel array section 10E according to a fifth embodiment. The unit pixel group 2 according to the fifth embodiment has three readout selection transistors 34U, 34M and 34D for each of the charge generation sections 32. The readout selection transistors 34U, 34M and 34D for the same charge generation section 32 are connected to the pixel signal generation sections 5 in different rows.

For example, a readout selection transistor 34M_3n in a 3n row (n is a positive integer equal to or greater than 1), a readout selection transistor 34D_3n−1 in a 3n−1 row and a readout selection transistor 34U_3n+1 in a 3n+1 row are connected to a pixel signal generation section 5_3n (excluding the readout selection transistor 34) in the 3n row. A readout selection transistor 34M_3n+1 in the 3n+1 row, a readout selection transistor 34D_3n in the 3n row and a readout selection transistor 34U_3n+2 in a 3n+2 row are connected to a pixel signal generation section 5_3n+1 (excluding the readout selection transistor 34) in the 3n+1 row. A readout selection transistor 34M_3n+2 in the 3n+2 row, a readout selection transistor 34D_3n+1 in the 3n+1 row and a readout selection transistor 34U_3n+3 in a 3n+3 row are connected to a pixel signal generation section 5_3n+2 (excluding the readout selection transistor 34) in the 3n+2 row. The upper, middle and lower charge generation sections 32 in each group share the reset transistor 36, floating diffusion 38, vertical selection transistor 40 and amplifying transistor 42.

The fifth embodiment is similar to the first one in that the rows of the readout selection transistors 34U, 34M and 34D to be activated can be selected to match progressive and interlaced scan. During interlaced scan, the upper, middle and lower readout selection transistors 34U, 34M and 34D, connected to the pixel signal generation section 5 in the row to be read out, are turned ON so that the floating diffusion 38 adds together the signal charges of the three charge generation sections 32.

Interlaced Scan

Fifth Embodiment

Figure 26:
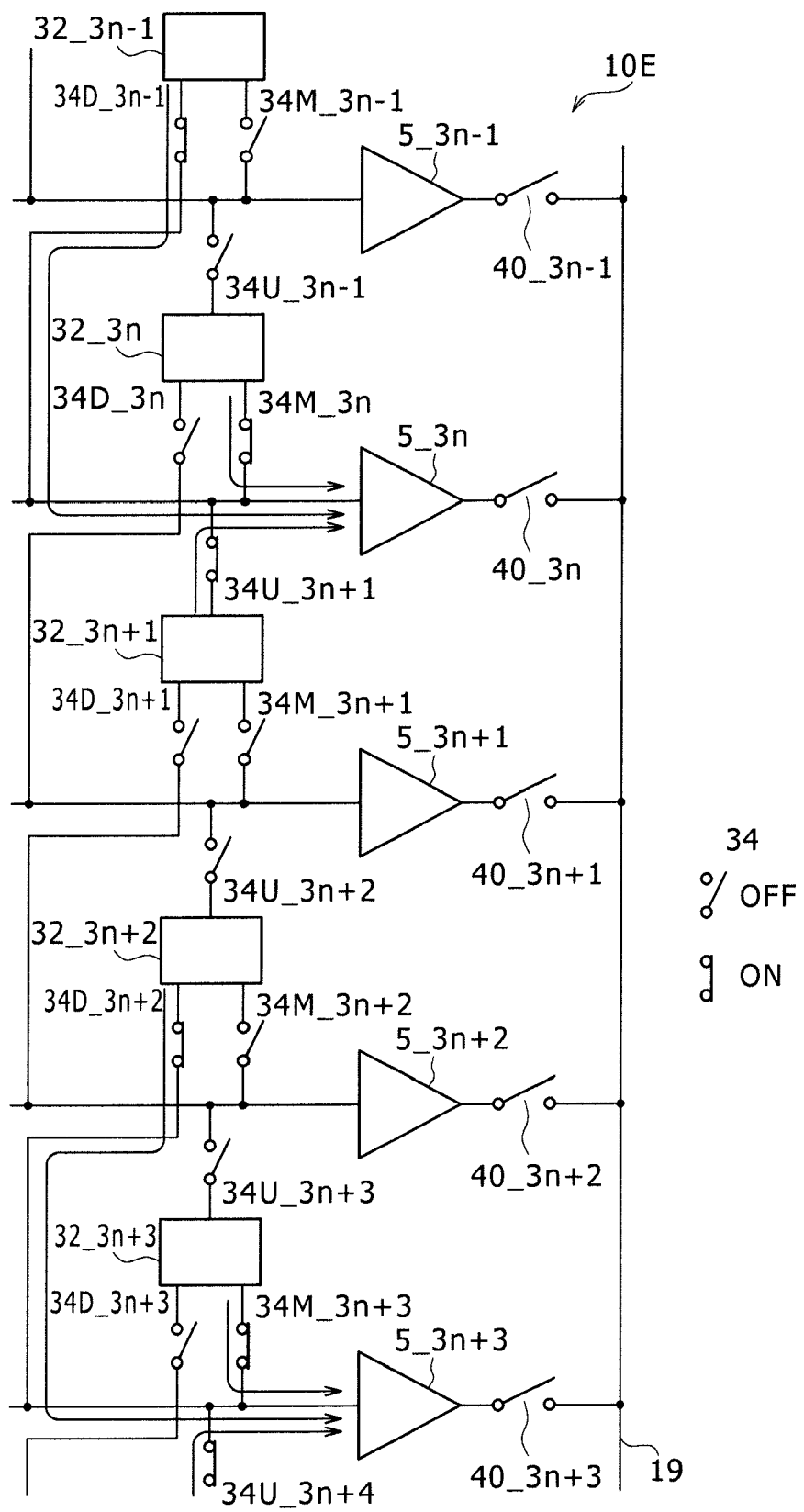
FIG. 26 is a diagram describing a signal flow during readout of a first field (combination of scan lines in 3n+1th rows) in interlaced scan in the fifth embodiment.
Figure 27:
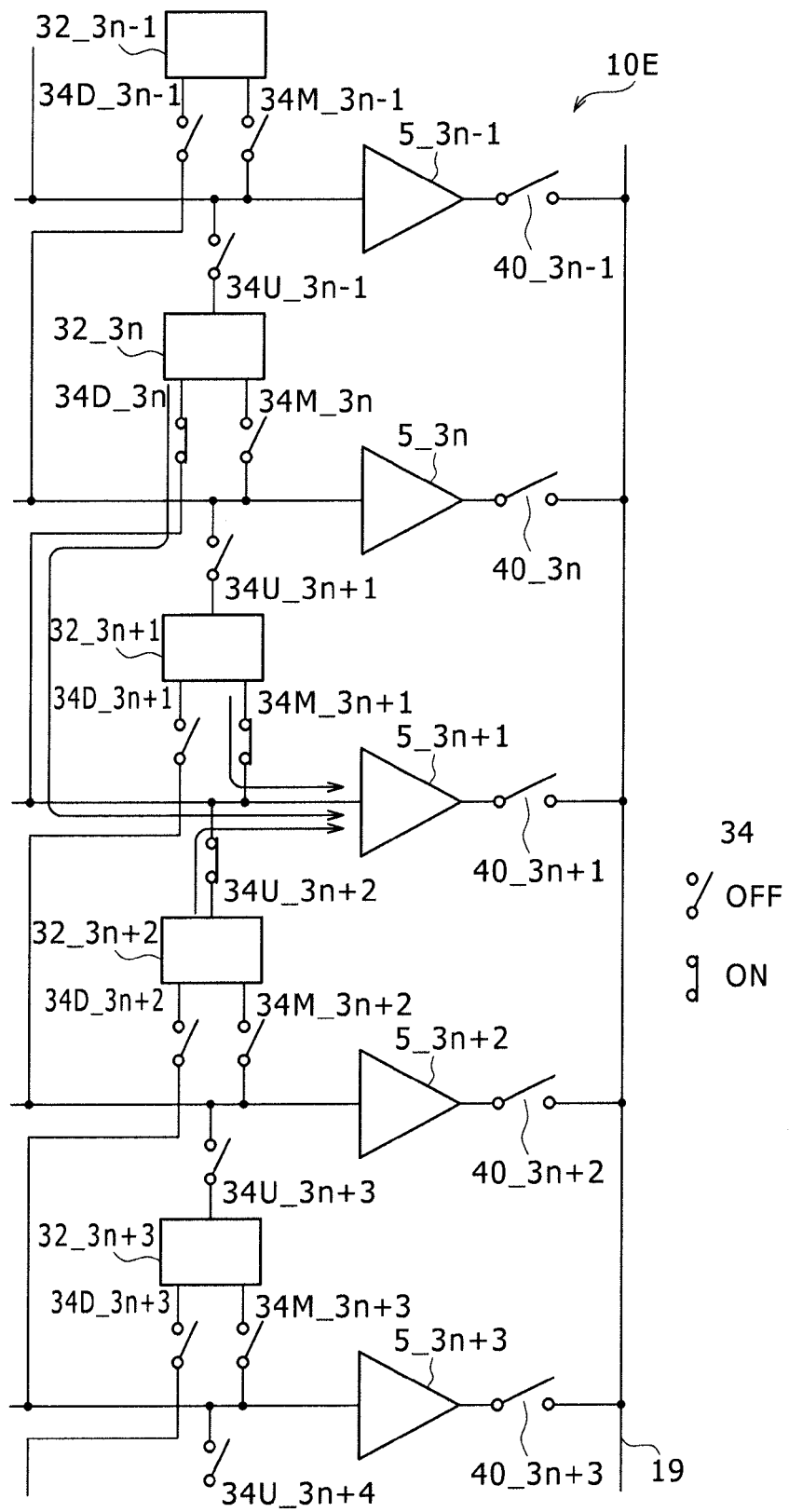
FIG. 27 is a diagram describing a signal flow during readout of a second field (combination of scan lines in 3n+1th rows) in interlaced scan in the fifth embodiment.
Figure 28:
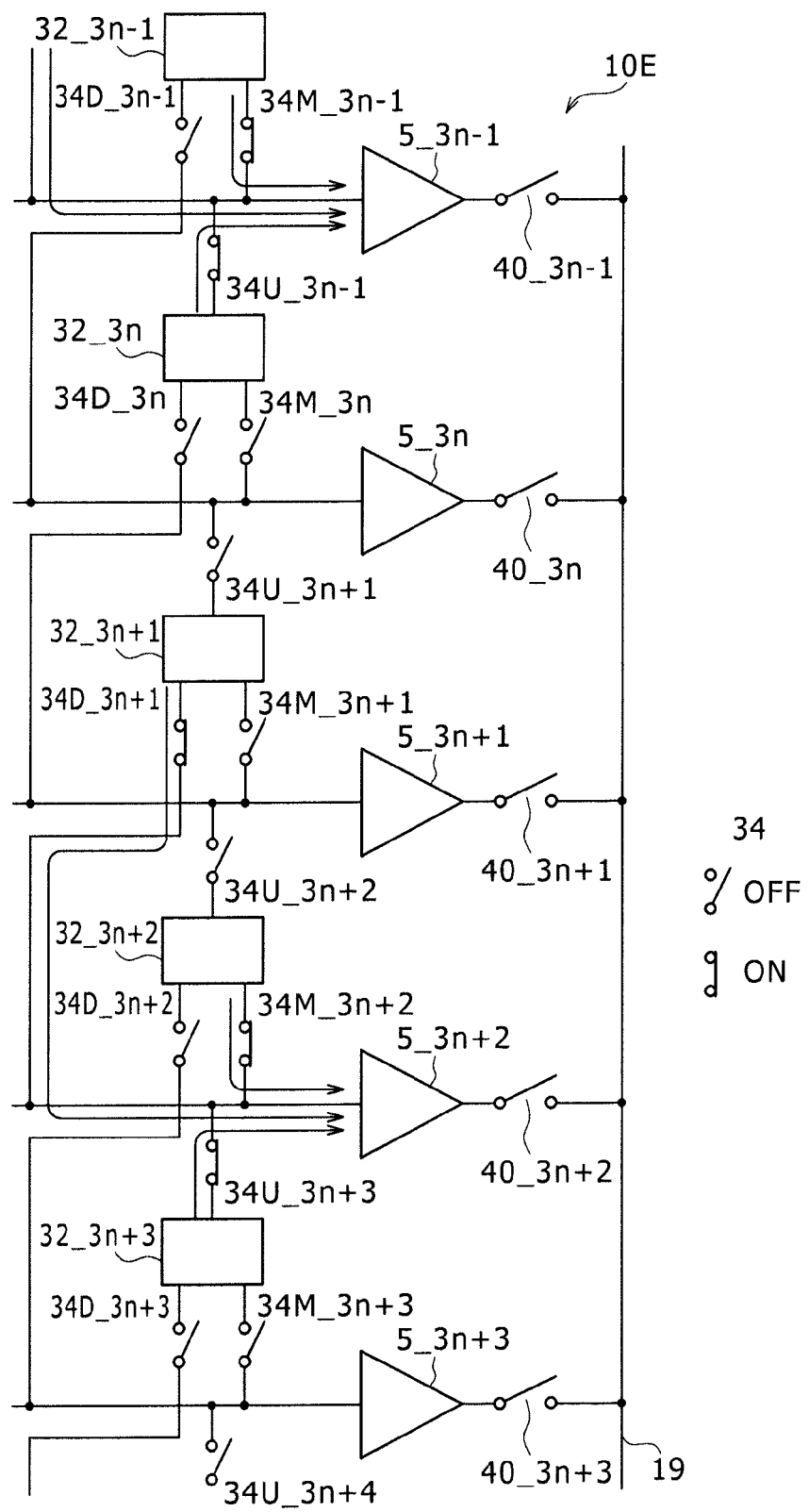
FIG. 28 is a diagram describing a signal flow during readout of a third field (combination of scan lines in 3n+2th rows) in interlaced scan in the fifth embodiment.

FIGS. 25A and 25B are diagrams describing the combinations of the charge generation sections 32 and pixel transistors for interlaced and progressive scan in the fifth embodiment. FIG. 26 is a diagram describing a signal flow during readout of a first field (combination of scan lines in 3nth rows) in interlaced scan in the fifth embodiment. FIG. 27 is a diagram describing a signal flow during readout of a second field (combination of scan lines in 3n+1th rows) in interlaced scan in the fifth embodiment. FIG. 28 is a diagram describing a signal flow during readout of a third field (combination of scan lines in 3n+2th rows) in interlaced scan in the fifth embodiment.

Interlaced scan of the fifth embodiment divides a screen into three images (first, second and third fields) and reads these images separately in three steps by reading every three vertical scan lines (rows of the pixel signal generation sections 5 and signal output sections 6 in this embodiment) of a screen.

First, a case will be described in which scan lines make up a first field with the pixel signals from the signal output sections 6 in the 3nth rows. As illustrated in FIG. 25A, the readout selection transistors 34D_3n−1, 34M_3n and 34U_3n+1 respectively in the 3n−1, 3n and 3n+1 rows are used in combination so that charge generation sections 32_3n−1, 32_3n and 32_3n+1 respectively in the 3n−1, 3n and 3n+1 rows share the pixel signal generation section 5_3n in the 3n row.

In this case, when a vertical selection transistor 40_3n is activated, the readout selection transistors 34D_3n−1, 34M_3n and 34U_3n+1 are all activated, as illustrated in FIG. 26. This allows for a floating diffusion 38_3n to add together the signal charges generated by the charge generation sections 32_3n−1, 32_3n and 32_3n+1. The resultant charge is converted into the pixel signal voltage Vx by the pixel signal generation section 5_3n first, and then transferred to the column AD conversion section 26 via the vertical signal line 19.

Next, a case will be described in which scan lines make up a second field with the pixel signals from the signal output sections 6 in the 3n+1th rows. As illustrated in FIG. 25A, the readout selection transistors 34D_3n, 34M_3n+1 and 34U_3n+2 respectively in the 3n, 3n+1 and 3n+2 rows are used in combination so that charge generation sections 32_3n, 32_3n+1 and 32_3n+2 respectively in the 3n, 3n+1 and 3n+2 rows share the pixel signal generation section 5_3n+1 in the 3n+1 row.

In this case, when a vertical selection transistor 40_3n+1 is activated, the readout selection transistors 34D_3n, 34M_3n+1 and 34U_3n+2 are all activated, as illustrated in FIG. 27. This allows for a floating diffusion 38_3n+1 to add together the signal charges generated by the charge generation sections 32_3n, 32_3n+1 and 32_3n+2. The resultant charge is converted into the pixel signal voltage Vx by the pixel signal generation section 5_3n+1 first, and then transferred to the column AD conversion section 26 via the vertical signal line 19.

Next, a case will be described in which scan lines make up a third field with the pixel signals from the signal output sections 6 in the 3n+2th rows. As illustrated in FIG. 25A, the readout selection transistors 34D_3n+1, 34M_3n+2 and 34U_3n+3 respectively in the 3n+1, 3n+2 and 3n+3 rows are used in combination so that charge generation sections 32_3n+1, 32_3n+2 and 32_3n+3 respectively in the 3n+1, 3n+2 and 3n+3 rows share the pixel signal generation section 5_3n+2 in the 3n+2 row.

In this case, when a vertical selection transistor 40_3n+2 is activated, the readout selection transistors 34D_3n+1, 34M_3n+2 and 34U_3n+3 are all activated, as illustrated in FIG. 28. This allows for a floating diffusion 38_3n+2 to add together the signal charges generated by the charge generation sections 32_3n+1, 32_3n+2 and 32_3n+3. The resultant charge is converted into the pixel signal voltage Vx by the pixel signal generation section 5_3n+2 first, and then transferred to the column AD conversion section 26 via the vertical signal line 19.

As described above, the readout selection transistors 34 (readout gates) are changed from one field to another during interlaced scan to select the pixel signal generation section 5 (e.g., floating diffusion 38) into which the signal charges are to be read. The unit pixel group 2 has the three readout selection transistors 34U, 34M and 34D for each of the charge generation sections 32. The three readout selection transistors 34U, 34M and 34D are provided for each of the charge generation sections 32. A selective combination of the transistors 34U, 34M and 34D makes it possible for the plurality of charge generation sections 32 to share the single pixel signal generation section 5 (e.g., floating diffusion 38 excluding the readout selection transistors 34). By selecting the rows of the readout selection transistors 34U, 34M and 34D to be activated to match interlaced scan, the signals in the form of charges can be added together by the floating diffusion 38.

The fifth embodiment differs from the first one in the manner in which the signal charges of the charge generation sections 32 are added together in the vertical direction and also in the manner in which a screen is divided. That is, the fifth embodiment adds together the signal charges of the charge generation sections 32 in two rows and divides a screen into two images by reading every two rows of the signal output sections 6. In contrast, the first embodiment adds together the signal charges of the charge generation sections 32 in three rows and divides a screen into three images by reading every three rows of the signal output sections 6. However, the two embodiments are basically the same in arrangement. Therefore, the fifth embodiment provides the same advantageous effects as the first one. The fifth embodiment provides three-fold improvement in S/N ratio as compared to the related art because of the three charge generation sections 32 to be added together. The fifth embodiment is also similar to the first one in that the inactive level of the gate of the other readout selection transistor 34 not used for signal charge transfer can be decreased to a lower-than-normal level during readout and/or electronic shutter.

Although not illustrated, the signal flow during progressive scan in the pixel structure according to the fifth embodiment is similar to that in the first embodiment. As illustrated in FIG. 25B, three examples are possible, the first one in which the charge generation section 32_k, a readout selection transistor 34M_k and the pixel signal generation section 5_k in the k row (k is a positive integer) are used in combination, the second one in which a charge generation section 32_k−1 and readout selection transistor 34D_k−1 in the k−1 row and the pixel signal generation section 5_k in the k row are used in combination, and the third one in which the charge generation section 32_k+1 and readout selection transistor 34U_k+1 in the k+1 row and the pixel signal generation section 5_k in the k row are used in combination. Naturally, modifications including switching between the first and second examples from one readout row to another are also possible.

Pixel Array Section

Sixth Embodiment

Figure 29:
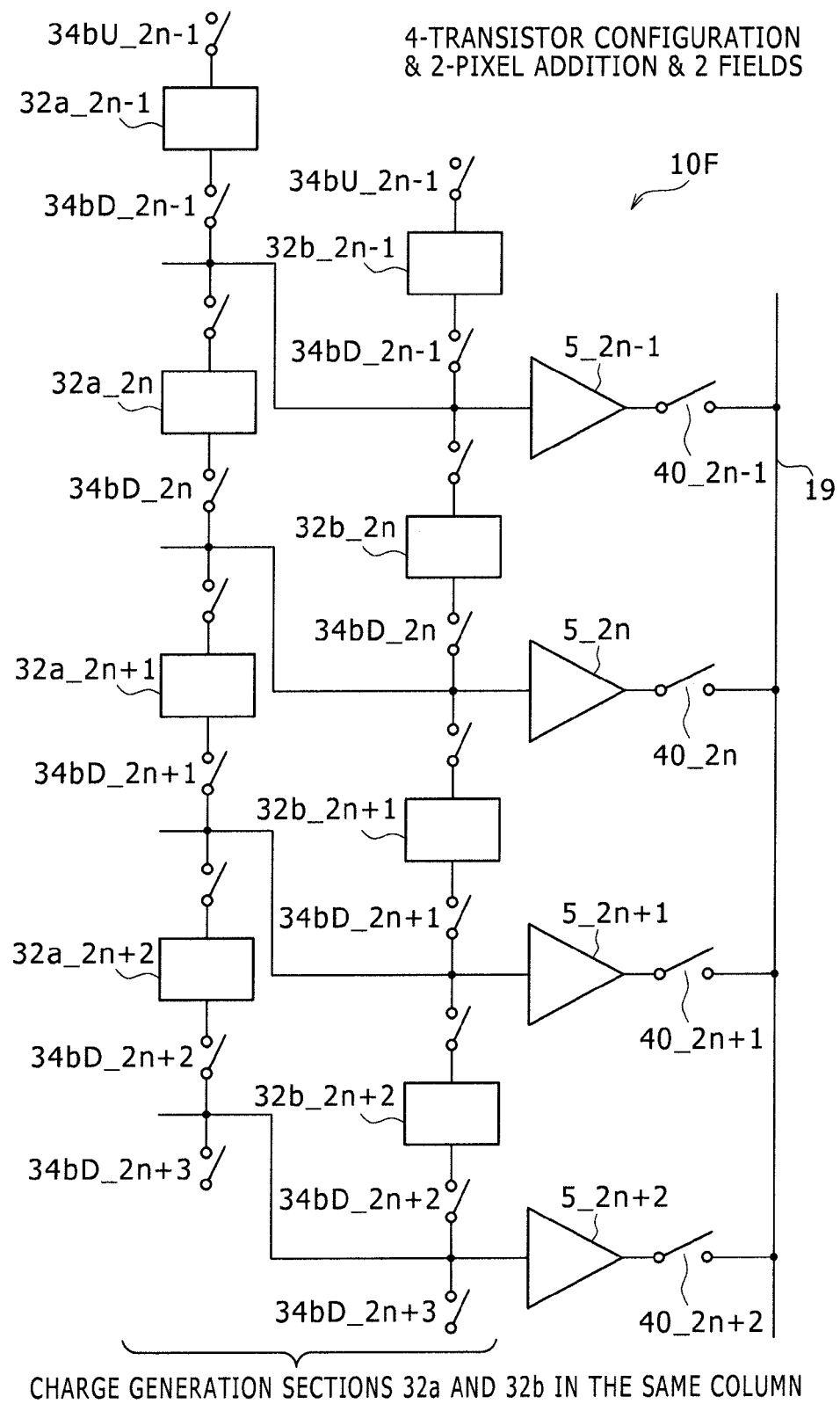
FIG. 29 is a diagram describing the pixel array section according to a sixth embodiment.

FIG. 29 is a diagram describing a pixel array section 10F according to a sixth embodiment. The unit pixel group 2 according to the sixth embodiment has a structure modified from the two-pixel sharing structure of the comparative example shown in FIG. 5 which adds together two pixels in the vertical direction, thus supporting interlaced scan. For the normal pixel structure which does not add together pixels in the vertical direction, pixels are not added together in the vertical direction during interlaced scan. This concept has been extended so that four pixels are added together during interlaced scan for the pixel sharing structure adapted to add together two pixels in the vertical direction during interlaced scan.

First, the two-pixel sharing structure has two pairs of charge generation section 32 and readout selection transistor 34, namely, a pair of the charge generation section 32a and readout selection transistor 34a and another pair of the charge generation section 32b and readout selection transistor 34b, for the single pixel signal generation section 5. Based on this, readout selection transistors 34aU and 34aD are provided for the charge generation section 32a, and readout selection transistors 34bU and 34bD for the charge generation section 32b in the sixth embodiment. In FIG. 29, the paired charge generation sections 32a and 32b are shown to be moved horizontally for convenience sake (for ease of illustration in the figure). However, we assume that these sections are in the same rows.

The readout selection transistors 34aU and 34aD for the same charge generation section 32a are connected to the pixel signal generation sections 5 in different rows. The readout selection transistors 34bU and 34bD for the same charge generation section 32b are connected to the pixel signal generation sections 5 in different rows. On the other hand, the readout selection transistors 34aU and 34bU associated with the paired charge generation sections 32a and 32b are connected to the pixel signal generation section 5 in the same row. The readout selection transistors 34aD and 34bD are connected to the pixel signal generation section 5 in the same row.

For example, therefore, readout selection transistors 34aD_2n and 34bD_2n in the 2n row and readout selection transistors 34aU_2n+1 and 34bU_2n+1 in the 2n+1 row are connected to the pixel signal generation section 5_2n (excluding the readout selection transistors 34) in the 2n row (n is a positive integer equal to or greater than 1). Readout selection transistors 34aD_2n−1 and 34bD_2n−1 in the 2n−1 row and readout selection transistors 34aU_2n and 34bU_2n in the 2n row are connected to the pixel signal generation section 5_2n−1 (excluding the readout selection transistors 34) in the 2n−1 row. The upper and lower charge generation sections 32a and 32b in each pair share the reset transistor 36, floating diffusion 38, vertical selection transistor 40 and amplifying transistor 42.

In the sixth embodiment, the readout selection transistors 34aU and 34bU are paired, and the readout selection transistors 34aD and 34bD are paired. The sixth embodiment is similar to the first one in that the rows of the readout selection transistors 34aU and 34bU and the readout selection transistors 34aD and 34bD to be activated can be selected to match progressive and interlaced scan. During interlaced scan, the upper and lower pairs of readout selection transistors 34aU, 34bU, 34aD and 34bD, connected to the pixel signal generation section 5 in the row to be read out, are turned ON so that the floating diffusion 38 adds together the signal charges of the four charge generation sections 32.

Interlaced Scan

Sixth Embodiment

Figure 31:
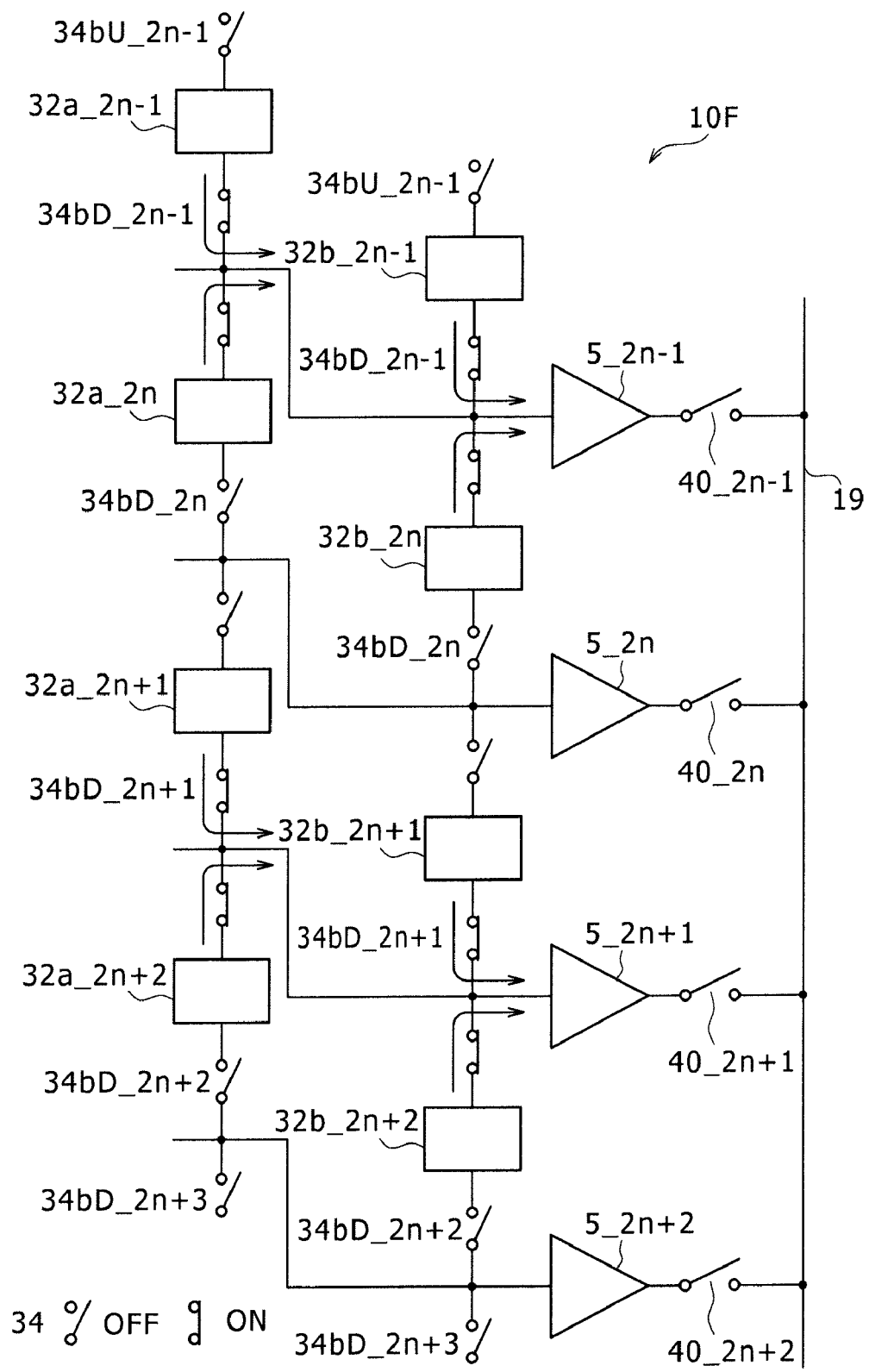
FIG. 31 is a diagram describing a signal flow during odd field readout in interlaced scan in the sixth embodiment.
Figure 32:
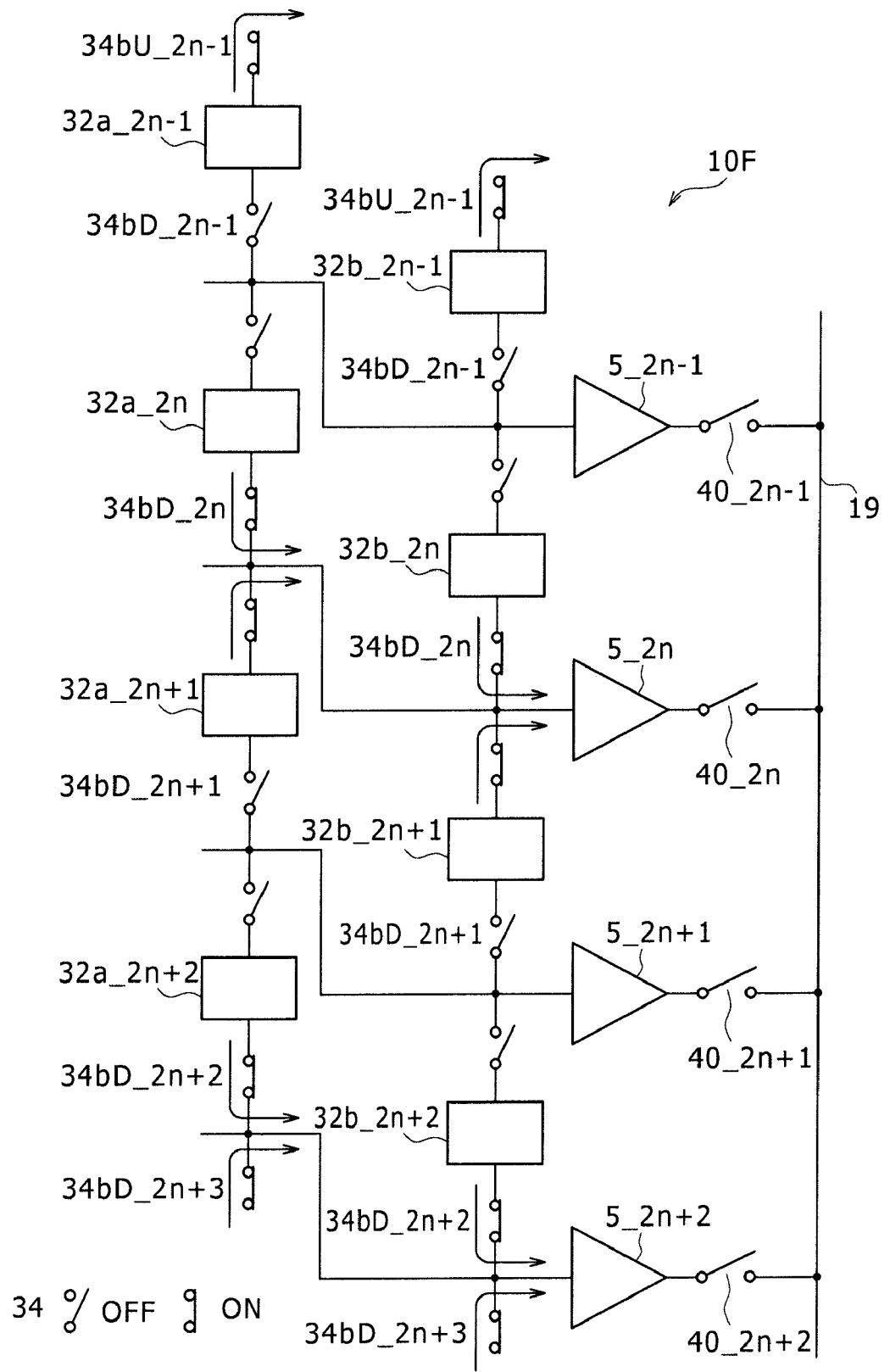
FIG. 32 is a diagram describing a signal flow during even field readout in interlaced scan in the sixth embodiment.

FIGS. 30A and 30B are diagrams describing the combinations of the charge generation sections 32 and pixel transistors for interlaced and progressive scan in the sixth embodiment. FIG. 31 is a diagram describing a signal flow during odd field readout during interlaced scan in the sixth embodiment. FIG. 32 is a diagram describing a signal flow during even field readout in interlaced scan in the sixth embodiment.

Interlaced scan of the sixth embodiment divides a screen into two images (even and odd fields) and reads these images separately in two steps by reading every three vertical scan lines (rows of the pixel signal generation sections 5 and signal output sections 6 in the present embodiment) of a screen. Although the detailed description thereof is omitted, it is only necessary to consider that each of the charge generation sections 32 and each of the readout selection transistors 34 in the first embodiment are divided respectively into the two charge generation sections 32a and 32b and the readout selection transistors 34a and 34b in the sixth embodiment, as can be supposed from FIG. 30A. The sixth embodiment is similar to the first one in that the inactive level of the gate of the other readout selection transistor 34 not used for signal charge transfer can be decreased to a lower-than-normal level during readout and/or electronic shutter.

Although not illustrated, the signal flow during progressive scan in the pixel structure according to the sixth embodiment is similar to that in the first embodiment. As illustrated in FIG. 30B, two examples are possible, the first one in which a charge generation section 32a_k, readout selection transistor 34aD_k, charge generation section 32b_k and readout selection transistor 34bD_k all in the k row (k is a positive integer) and the pixel signal generation section 5_k in the k row are used in combination, and the second one in which a charge generation section 32*a*_k+1, readout selection transistor 34*a*U_k+1, charge generation section 32*b*_k+1 and readout selection transistor 34*b*U_k+1 all in the k+1 row (k is a positive integer) and the pixel signal generation section 5_*k* in the k row are used in combination. Naturally, modifications including switching between the first and second examples from one readout row to another are also possible.

Imaging Device

Seventh Embodiment

Figure 33:
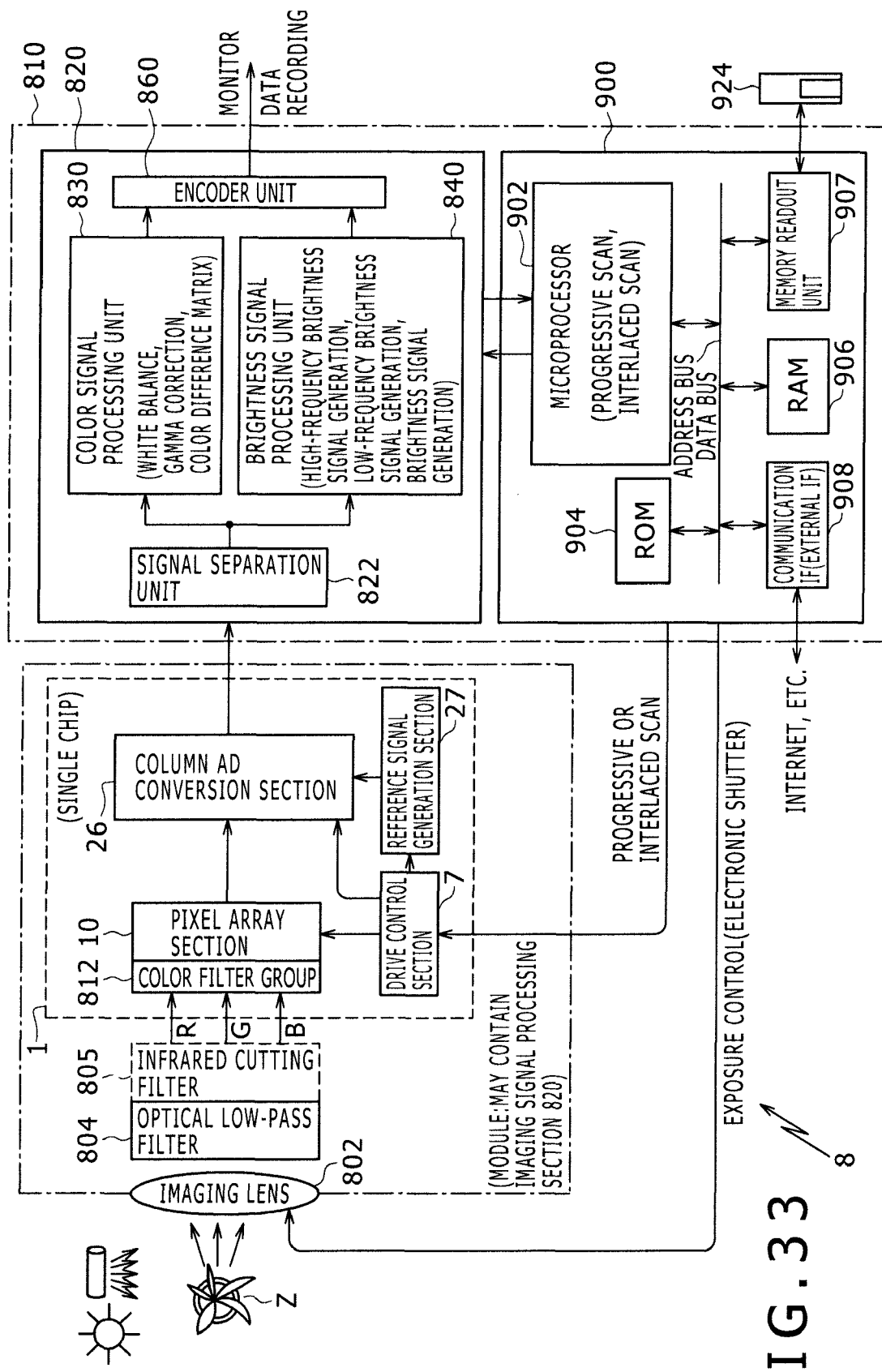
FIG. 33 is a schematic configuration diagram of an imaging device (seventh embodiment).

FIG. 33 is a diagram describing a seventh embodiment. The seventh embodiment is an application of the arrangement for interlaced and progressive scan, used in the above embodiments of the solid-state imaging device 1, to an imaging device which is an example of physical information acquisition device. FIG. 33 is a schematic configuration diagram of an imaging device 8.

The imaging device according to the present invention also supports interlaced and progressive scan and permits implementation of an arrangement which contributes to smooth rendering of a moving subject and improved time resolution through interlaced scan during moving image capture. At this time, for example, control over at least the scan schemes can be specified arbitrarily by setting control instruction information into the communication/timing control section 20 from an external main control section.

More specifically, the imaging device 8 includes an imaging lens 802, optical low-pass filter 804, a color filter group 812, the pixel array section 10, drive control section 7, column AD conversion section 26, reference signal generation section 27 and a camera signal processing block 810. As shown by a dashed line in FIG. 33, an infrared cutting filter 805 may be provided together with the optical low-pass filter 804. The same filter 805 is designed to reduce the infrared component.

Further, a power source section 300 including positive and negative power sources 302 and 304 is provided in the present embodiment separately from the semiconductor region (semiconductor chip) in which the pixel array section 10, drive control section 7, column AD conversion section 26 and reference signal generation section 27 are formed.

The imaging lens 802 forms an image by guiding light L carrying the image of a subject Z under illumination, for example, with fluorescent light or sunlight, into the imaging device. The color filter group 812 has, for example, R, G and B color filters arranged in a Bayer pattern. The drive control section 7 drives the pixel array section 10. The readout current control section 24 controls the pixel signal operating current from the pixel array section 10. The column AD conversion section 26 handles CDS processing and AD conversion of the pixel signal from the pixel array section 10. The reference signal generation section 27 supplies the reference signal SLP_ADC to the column AD conversion section 26. The camera signal processing block 810 processes the imaging signal from the column AD conversion section 26.

The camera signal processing block 810 provided at the subsequent stage of the column AD conversion section 26 includes an imaging signal processing section 820 and camera control section 900. The same section 900 serves as a main control section adapted to control the imaging device 8 as a whole. The imaging signal processing section 820 includes a signal separation unit 822, color signal processing unit 830, brightness signal processing unit 840 and encoder unit 860.

The signal separation unit 822 has a primary color separation function adapted to separate the digital imaging signal from the AD conversion function section of the column AD conversion section 26 into R (red), G (green) and B (blue) primary color signals when non-primary color filters are used as color filters. The color signal processing unit 830 processes a color signal C based on the primary color signals R, G and B separated by the signal separation unit 822. The brightness signal processing unit 840 processes a brightness signal Y based on the primary color signals R, G and B separated by the signal separation unit 822. The encoder unit 860 generates a video signal VD based on the brightness signal Y and color signal C.

The color signal processing unit 830 includes, for example, a white balance amplifier, gamma correction section and color difference matrix section although the illustration thereof is omitted. The brightness signal processing unit 840 includes, for example, high- and low-frequency brightness signal generation sections and a brightness signal generation section although the illustration thereof is omitted. The high-frequency brightness signal generation section generates a brightness signal YH based on the primary color signals from a primary color separation section of the signal separation unit 822. The brightness signal YH contains some components relatively high in frequency. The low-frequency brightness signal generation section generates a brightness signal YL based on the white-balance-adjusted primary color signals from the white balance amplifier. The brightness signal YL contains only the components relatively low in frequency. The brightness signal generation section generates a brightness signal Y based on the two brightness signals YH and YL and supplies the same signal Y to the encoder unit 860. The brightness signal YL is also used for exposure control.

The encoder unit 860 digitally modulates color difference signals R-Y and B-Y with a digital signal associated with a color signal subcarrier first and then synthesizes the resultant signal and the brightness signal Y generated by the brightness signal processing unit 840 for conversion into the digital video signal VD (=Y+S+C; S is a synchronizing signal, and C a chroma signal). The digital video signal VD from the encoder unit 860 is supplied to the camera signal output section, provided at a further subsequent stage, whose illustration is omitted, for monitor output and data recording to a recording medium. At this time, the digital video signal VD is converted, as necessary, to an analog video signal by DA conversion.

The camera control section 900 according to the present embodiment includes a microprocessor 902, ROM (Read Only Memory) 904 which is a read-only storage section, RAM (Random Access Memory) 906 and other peripheral members whose illustration is omitted. The microprocessor 902 is similar to the one playing a core role in a computer and is typically a CPU (Central Processing Unit) achieved by consolidating arithmetic and control functions handled by a computer into ultra-small integrated circuits. The RAM 906 is an example of volatile storage section which is rewritable and readable at any time. The microprocessor 902, ROM 904 and RAM 906 are also collectively referred to as a microcomputer.

The camera control section 900 controls the system as a whole. Particularly in the present embodiment, the same section 900 is capable of controlling interlaced and progressive scan. In relation to this capability, the camera control section 900 supplies information as to which of the two scan schemes is to be used to the drive control section 7. The ROM 904 stores programs for the camera control section 900. Particularly in the present example, the ROM 904 stores a program adapted to control interlaced and progressive scan. The RAM 906 stores data required for the camera control section 900 to handle various types of processing.

Further, the camera control section 900 is configured to permit attachment and detachment of a recording medium 924 such as memory card and to permit connection to a communication network such as the Internet. For example, the camera control section 900 includes a memory readout unit 907 and communication IF (interface) 908 in addition to the microprocessor 902, ROM 904 and RAM 906.

The recording medium 924 is used, for example, to store a wide range of data, including program data to be processed by the microprocessor 902 with software, convergence range of photometric data DL based on the brightness signals from the brightness signal processing unit 840, and settings of various control information for exposure control processing (including electronic shutter control).

The memory readout unit 907 stores (installs) the data read out from the recording medium 924 to the RAM 906. The communication IF 908 mediates the exchange of communication data with the Internet or other communication network.

The imaging device 8 is shown to be in a modular form having the drive control section 7 and column AD conversion section 26 separately from the pixel array section 10. It is needless to say, however, that the solid-state imaging device 1 having the drive control section 7 and column AD conversion section 26 formed integrally with the pixel array section 10 on the same semiconductor substrate may be used, as described in relation to the same device 1. Further, the imaging device 8 is shown in FIG. 33 to include an optical system such as the imaging lens 802, optical low-pass filter 804 or infrared cutting filter 805, in addition to the pixel array section 10, drive control section 7, column AD conversion section 26, reference signal generation section 27 and camera signal processing block 810. This embodiment is preferred when the imaging device 8 is used as an imaging-capable module having the above components packaged together therein.

Here, as for the relationship between the solid-state imaging device 1 and module, the same device 1 may be provided in the form of an imaging-capable module. This module has, as illustrated in FIG. 33, the pixel array section 10 (imaging section) packaged together with the signal processing section (excluding the camera signal processing block at the subsequent stage of the column AD conversion section 26) such as the column AD conversion section 26 having the AD conversion and difference (CDS) processing functions which is closely related to the pixel array section 10. Then, the camera signal processing block 810, which is the remaining signal processing section, is provided at the subsequent stage of the solid-state imaging device 1 provided in the form of a module. The solid-state imaging device 1 and camera signal processing block 810 together make up the imaging device 8 as a whole.

Alternatively, although not illustrated, the solid-state imaging device 1 may be provided in the form of an imaging-capable module having the pixel array section 10 packaged together with the optical system such as the imaging lens 802. Then, the camera signal processing block 810 is also provided in the module so that the same section 810 and solid-state imaging device 1 together make up the imaging device 8 as a whole. Still alternatively, the module of the solid-state imaging device 1 may include the camera signal processing block 810. In this case, the solid-state imaging device 1 can be substantially considered the same thing as the imaging device 8. The same device 8 is provided, for example, as a camera-equipped or imaging-capable mobile equipment adapted to perform "imaging." It should be noted that the term "imaging" includes not only image capture during normal camera photography but also, in a board sense, fingerprint detection and others.

The imaging device 8 configured as described above includes all the functions of the solid-state imaging device 1 and can be basically configured and operate in the same manner as the solid-state imaging device 1. In particular, interlaced scan during moving image capture provides an image with smoothly rendered motion of the moving subject and ensures improved S/N ratio without causing increased chip size, reduced conversion efficiency or reduced saturation signal level.

Although the preferred embodiments have been described above, the technical scope of the present invention is not limited to the scope described in these embodiments. The present invention may be changed or modified in various ways without departing from the scope and spirit of the present invention, and embodiments including such changes or modifications are also included in the technical scope of the present invention.

Further, the above embodiments are not limiting the invention as set forth in the appended claims, and not all combinations of the features described in the embodiments constitute essential solving means of the invention. The above embodiments include various stages of the invention, and various inventions can be extracted by an appropriate combination of a plurality of disclosed constituting elements. Even if some of the constituting elements are removed from all the elements, the configuration devoid of such constituting elements can be still extracted as an invention so long as it provides the advantageous effects of the invention.

For example, interlaced scan adapted to split each frame into two and three fields has been described specifically in the above embodiments. However, interlaced scan may split each frame into four or more fields. To accomplish this, it is only necessary to have the N readout selection transistors 34 for each of the charge generation sections 32 and connect the same transistors 34 to the pixel signal generation sections 5 in different rows. Therefore, the basic concept is the same as in the above embodiments.

Further, a description has been given in the sixth embodiment of application of interlaced scan to a pixel sharing structure with the signal output section 6 having four transistors (34, 36, 40 and 42). However, the same functions and advantageous effects as described in the sixth embodiment can be achieved for the pixels having a three-transistor configuration devoid of the vertical selection transistor 40. Even in this case, the arrangement according to the sixth embodiment is applicable to the pixels operating on the same principle, such as those having the plurality of readout selection transistors 34 for each of the two photodiodes (charge generation sections 32) to support interlaced scan.

To apply the present invention to color image capture, the color filters need only be arranged to support field accumulation for interline transfer CCD.

In the above embodiments, the description has been given taking, as an example, a sensor including unit pixels, each of which is made up of NMOS transistors. However, the present invention is not limited thereto. The present invention provides the same functions and advantageous effects as described in the above embodiments by reversing the relationship in control signal potentials (reversing the positive and negative potentials) according to the signal charges and transistor polarities.

That is, PMOS transistors, opposite in conductivity type to NMOS transistors used in the above embodiments, are employed for at least the readout selection transistors 34 in a MOS solid-state imaging device using holes as signal charges. Even in this case, it is only necessary to provide the plurality of PMOS readout selection transistors 34 for each of the charge generation sections 32 and connect the same transistors 34 to the pixel signal generation sections 5 and signal output sections 6 in different rows so as to support interlaced scan.

As for the configuration of the unit pixel 3, the substrate and semiconductor region may all be changed to an opposite conductivity type with the condition shown in the embodiments remaining unchanged. Also in this case, a modification need only be made, as necessary, so that the signal charges and the relationship in control signal potentials (the positive and negative potentials) are reversed.

The present application contains subject matter related to that disclosed in Japanese Priority Patent Application JP 2008-142336 filed in the Japan Patent Office on May 30, 2008, the entire content of which is hereby incorporated by reference.

What is claimed is:

1. A solid-state imaging device comprising:
 a pixel array section having unit pixels arranged two-dimensionally, each of the unit pixels including:
  a charge generation section configured to generate a signal charge,
  charge transfer sections configured to transfer the signal charge generated by the charge generation section, and
  a signal output section configured to generate and output a target signal commensurate with a signal generated by the charge generation section, wherein
 the plurality of charge transfer sections provided for each of the charge generation sections are connected to signal output sections in different rows.

2. The solid-state imaging device of claim 1 comprising:
 a drive control section configured to control the plurality of charge transfer sections and signal output sections, wherein
 the drive control section performs interlaced scan adapted to read out target signals by reading out fields, each made up of 1/N rows of the signal output sections at different positions, in N steps,
 the drive control section transfers, for each field, the signal charges generated by the N charge generation sections in different rows to the signal output section in the same row so as to generate and output a target signal obtained by synthesizing the N signal charges, and
 the drive control section controls the charge transfer sections and signal output sections so that the combination of the rows of the N charge transfer sections is different from one field to another.

3. The solid-state imaging device of claim 2, wherein
 the drive control section performs control so that the inactive level of the charge transfer section not used for signal charge transfer can be decreased to a lower-than-normal level during signal charge readout or electronic shutter.

4. The solid-state imaging device of claim 2, wherein
 the drive control section performs progressive scan adapted to sequentially read out target signals from the signal output sections in order of rows by controlling the charge transfer sections so that the signal charge is transferred by one of the plurality of charge transfer sections.

5. A solid-state imaging device comprising:
 a pixel array section having unit pixels arranged two-dimensionally, each of the unit pixels including
  a charge generation section configured to generate a signal charge,
  charge transfer sections configured to transfer the signal charge generated by the charge generation section, and
  a signal output section configured to generate and output a target signal commensurate with the signal generated by the charge generation section, wherein
 the plurality of charge transfer sections are provided for each of the charge generation sections such that
 the signal output section in each row can switch between two operations, one configured to receive a signal charge from the charge generation section in one of the rows, and another configured to receive a signal charge from the charge generation section in its own row to which the signal output section belongs or from the one in a row other than its own row.

6. The solid-state imaging device of claim 5 comprising:
 a drive control section configured to control the plurality of charge transfer sections and signal output sections, wherein
 the drive control section performs interlaced scan adapted to read out target signals by reading out fields of a screen, each made up of 1/N rows of the signal output sections at different positions, in N steps,
 the drive control section transfers, for each field, the signal charges generated by the N charge generation sections in different rows to the signal output section in the same row so as to generate and output a target signal obtained by synthesizing the N signal charges, and
 the drive control section controls the charge transfer sections and signal output sections so that the combination of the rows of the N charge transfer sections is different from one field to another.

7. The solid-state imaging device of claim 5, wherein
 the drive control section performs control so that the inactive level of the charge transfer section not used for signal charge transfer can be decreased to a lower-than-normal level during signal charge readout or electronic shutter.

8. The solid-state imaging device of claim 5, wherein
 the drive control section performs progressive scan adapted to sequentially read out target signals from the signal output sections in order of rows by controlling the charge transfer sections so that the signal charge is transferred by one of the plurality of charge transfer sections.

9. An imaging device comprising:
 a pixel array section having unit pixels arranged two-dimensionally, each of the unit pixels including
  a charge generation section configured to generate a signal charge,
  charge transfer sections configured to transfer the signal charge generated by the charge generation section, and
  a signal output section configured to generate and output a target signal commensurate with the charge of the signal generated by the charge generation section;
 a drive control section configured to control the operation of the plurality of charge transfer sections and signal output sections; and
 a main control section configured to control the drive control section, wherein a plurality of charge transfer sections, provided for a same charge generation section, are connected to the signal output sections in different rows.

10. A driving method for a solid-state imaging device, implemented via a solid-state imaging device including:
   a pixel array section having unit pixels arranged two-dimensionally, each of the unit pixels including
      a charge generation section,
      a plurality of charge transfer sections for each of the charge generation sections, each of the charge transfer sections configured to transfer a signal charge generated by the charge generation section, and
      a signal output section configured to generate and output a target signal commensurate with the charge of the signal generated by the charge generation section, the driving method comprising:
performing interlaced scan adapted to read out target signals by reading out fields, each made up of 1/N rows of signal output sections at different positions, in N steps;
transferring, for each field, the generated signal charges by the N charge generation sections in different rows to a signal output section in the same row so as to generate and output a target signal obtained by synthesizing the N signal charges; and
controlling the charge transfer sections and signal output sections so that the combination of the rows of the N charge transfer sections is different from one field to another.

* * * * *